(12) United States Patent
Baek

(10) Patent No.: US 10,971,432 B2
(45) Date of Patent: Apr. 6, 2021

(54) SEMICONDUCTOR DEVICE INCLUDING A THROUGH WIRING AREA

(71) Applicant: SAMSUNG ELECTRONICS CO., LTD., Suwon-si (KR)

(72) Inventor: Seok Cheon Baek, Hwaseong-si (KR)

(73) Assignee: SAMSUNG ELECTRONICS CO., LTD.

(*) Notice: Subject to any disclaimer, the term of this patent is extended or adjusted under 35 U.S.C. 154(b) by 0 days.

(21) Appl. No.: 16/388,370

(22) Filed: Apr. 18, 2019

(65) Prior Publication Data
US 2020/0043830 A1   Feb. 6, 2020

(30) Foreign Application Priority Data

Aug. 6, 2018 (KR) .................... 10-2018-0091300
Sep. 11, 2018 (KR) .................... 10-2018-0108144

(51) Int. Cl.
*H01L 23/48* (2006.01)
*H01L 27/11582* (2017.01)
*H01L 27/11556* (2017.01)

(52) U.S. Cl.
CPC ...... *H01L 23/481* (2013.01); *H01L 27/11556* (2013.01); *H01L 27/11582* (2013.01)

(58) Field of Classification Search
CPC ............ H01L 23/481; H01L 27/11556; H01L 27/11582; H01L 27/11575; H01L 27/11573; H01L 27/11565; H01L 27/11519; H01L 27/11524; H01L 27/11529; H01L 27/1157
See application file for complete search history.

(56) References Cited

U.S. PATENT DOCUMENTS

| | | | |
|---|---|---|---|
| 9,728,499 B2 | 8/2017 | Shimabukuro et al. | |
| 9,741,733 B2 | 8/2017 | Lim et al. | |
| 9,818,693 B2 | 11/2017 | Toyama et al. | |
| 9,853,038 B1 | 12/2017 | Cui et al. | |
| 9,865,540 B2 | 1/2018 | Kim et al. | |
| 2017/0179153 A1* | 6/2017 | Ogawa | H01L 27/11575 |
| 2017/0358590 A1 | 12/2017 | Kang et al. | |

FOREIGN PATENT DOCUMENTS

KR   1020130023616   3/2013
KR   10-2017-0046892   5/2017

* cited by examiner

*Primary Examiner* — Edward Chin
(74) *Attorney, Agent, or Firm* — F. Chau & Associates, LLC

(57) ABSTRACT

A semiconductor device includes a peripheral circuit area disposed on a first substrate and including circuit devices. A memory cell area is disposed on a second substrate and includes memory cells. A through wiring area includes a through contact plug and an insulating area. The through contact plug extends through the memory cell area and the second substrate and connects the memory cell area to the circuit devices. The insulating area surrounds the through contact plug. The insulating area includes a first insulating layer penetrating through the second substrate, a plurality of second insulating layers, a third insulating layer having a vertical extension portion, and a plurality of horizontal extension portions extended in parallel to a top surface of the second substrate from a side surface of the vertical extension portion to contact the second insulating layers.

19 Claims, 30 Drawing Sheets

SEMICONDUCTOR DEVICE INCLUDING A THROUGH WIRING AREA

CROSS-REFERENCE TO RELATED APPLICATION(S)

This application claims the benefit of and priority to Korean Patent Application No. 10-2018-0091300, filed on Aug. 6, 2018 in the Korean Intellectual Property Office, and Korean Patent Application No. 10-2018-0108144, filed on Sep. 11, 2018 in the Korean Intellectual Property Office, the disclosures of which are herein incorporated by reference in their entirety.

TECHNICAL FIELD

The present inventive concept relates to a semiconductor device and, more specifically, to a semiconductor device having a through wiring area.

DISCUSSION OF RELATED ART

Semiconductor devices have been designed to be smaller in size and to have a higher capacity for processing data. For example, in the case of a semiconductor memory device, as a size of a memory cell has been reduced to implement higher integration. In these devices, an arrangement structure and/or a wiring structure of included operating circuits have become more complex.

SUMMARY

A semiconductor device includes a peripheral circuit area disposed on a first substrate and including one or more circuit devices. A memory cell area is disposed on a second substrate and includes a plurality of memory cells. A through wiring area includes a through contact plug and an insulating area. The through contact plug extends in a first direction through the memory cell area and the second substrate and electrically connects the memory cell area to the circuit devices. The insulating area at least partially surrounds the through contact plug. The insulating area includes a first insulating layer penetrating through the second substrate and disposed in parallel to the second substrate, a plurality of second insulating layers extended in the first direction, and a third insulating layer having a vertical extension portion and a plurality of horizontal extension portions. The vertical extension portion is disposed between the second insulating layers and extended in the first direction. The plurality of horizontal extension portions are extended in a second direction parallel to a top surface of the second substrate from a side surface of the vertical extension portion to contact the second insulating layers.

A semiconductor device includes a peripheral circuit area disposed on a first substrate and including one or more circuit devices. A memory cell area is disposed on a second substrate disposed in an upper portion of the first substrate, and includes a plurality of gate electrodes, spaced apart from each other and stacked vertically on the second substrate, and channels, penetrating through the gate electrodes and extended vertically on the second substrate. A through wiring area includes an insulating area penetrating through the gate electrodes and the second substrate, and a through contact plug penetrating through the insulating area and extended vertically. The insulating area has a plurality of vertical extension portions extended in a first direction perpendicular to the first and second substrates, and horizontal extension portions extended in a second direction, perpendicular to the first direction, from side surfaces of the vertical extension portions.

A semiconductor device includes a first area having one or more first devices. A second area is disposed in a side of the first area and includes one or more second devices. A through wiring area is disposed in an upper portion of the second area, and includes a through wiring structure electrically connecting the first devices to the second devices and an insulating area at least partially surrounding the through wiring structure. The insulating area includes vertical insulating layers extended in a first direction, and horizontal insulating layers extended in a second direction, perpendicular to the first direction, between the vertical insulating layers.

BRIEF DESCRIPTION OF DRAWINGS

A more complete appreciation of the present disclosure and many of the attendant aspects and features thereof will be more clearly understood from the following detailed description, taken in conjunction with the accompanying drawings, in which.

DETAILED DESCRIPTION

Hereinafter, example embodiments of the present inventive concept will be described with reference to the accompanying drawings.

Figure 1:
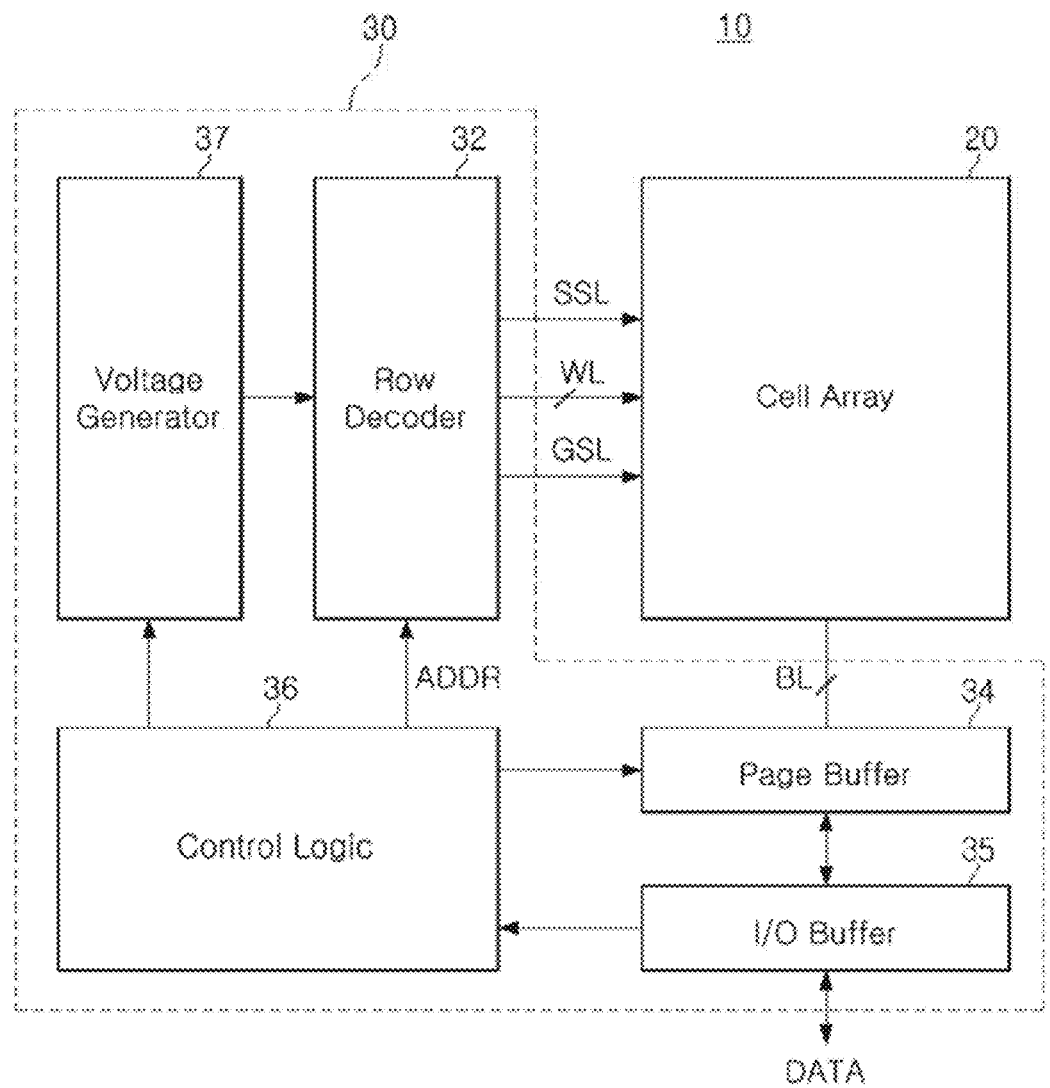
FIG. 1 is a block diagram illustrating a semiconductor device according to an example embodiment in the present inventive concept.

FIG. 1 is a block diagram illustrating a semiconductor device according to an example embodiment of the present inventive concept.

Referring to FIG. 1, a semiconductor device 10 may include a memory cell array 20 and a peripheral circuit 30. The peripheral circuit 30 may include a row decoder 32, a page buffer 34, an input/output buffer 35, a control logic 36, and a voltage generator 37.

The memory cell array 20 may include a plurality of memory blocks, and each of the memory blocks may include a plurality of memory cells. The plurality of memory cells may be connected to the row decoder 32 through a string selection line SSL, word lines WL, and a ground selection line GSL, and the memory blocks may additionally be connected to the page buffer 34 through bit lines BL. In example embodiments of the present inventive concept, memory cells arranged in the same row may be connected to the same word line WL, and memory cells arranged in the same column may be connected to the same bit line BL.

The row decoder 32 may decode an input address ADDR, generate a driving signal of the word line WL, and transfer the driving signal. The row decoder 32 may provide a word line voltage generated from the voltage generator 37 in response to the control logic 36 to a selected word line WL and a non-selected word line WL.

The page buffer 34 may be connected to the memory cell array 20 through the bit lines BL, and may read out information stored in the memory cells. The page buffer 34 may temporarily store data to be stored in the memory cells, or may read data stored in the memory cells, depending on an operational mode. The page buffer 34 may include a column decoder and a sense amplifier. The column decode may selectively activate the bit lines BL of the memory cell array 20, and the sense amplifier may sense a voltage of the selected bit line BL by the column decoder and read out data stored in the selected memory cell in a readout operation.

The input/output buffer 35 may receive an input of data and transfer the data to the page buffer 34 in a program operation, and in a readout operation, the input/output buffer 35 may externally output the data received from the page buffer 34. The input/output buffer 35 may transfer an input address or an input command to the control logic 36.

The control logic 36 may control operations of the row decoder 32 and the page buffer 34. The control logic 36 may receive a control signal and an external voltage transferred from an external source, and may undertake operation in response to the received control signal. The control logic 36 may control a readout operation, a writing operation, and/or an erasing operation in response to the control signals.

The voltage generator 37 may generate voltages required for an internal operation, such as a program voltage, a readout voltage, an erase voltage, and the like, for example, using an external voltage. The voltages generated by the voltage generator 37 may be transferred to the memory cell array 20 through the row decoder 32.

Figure 2:
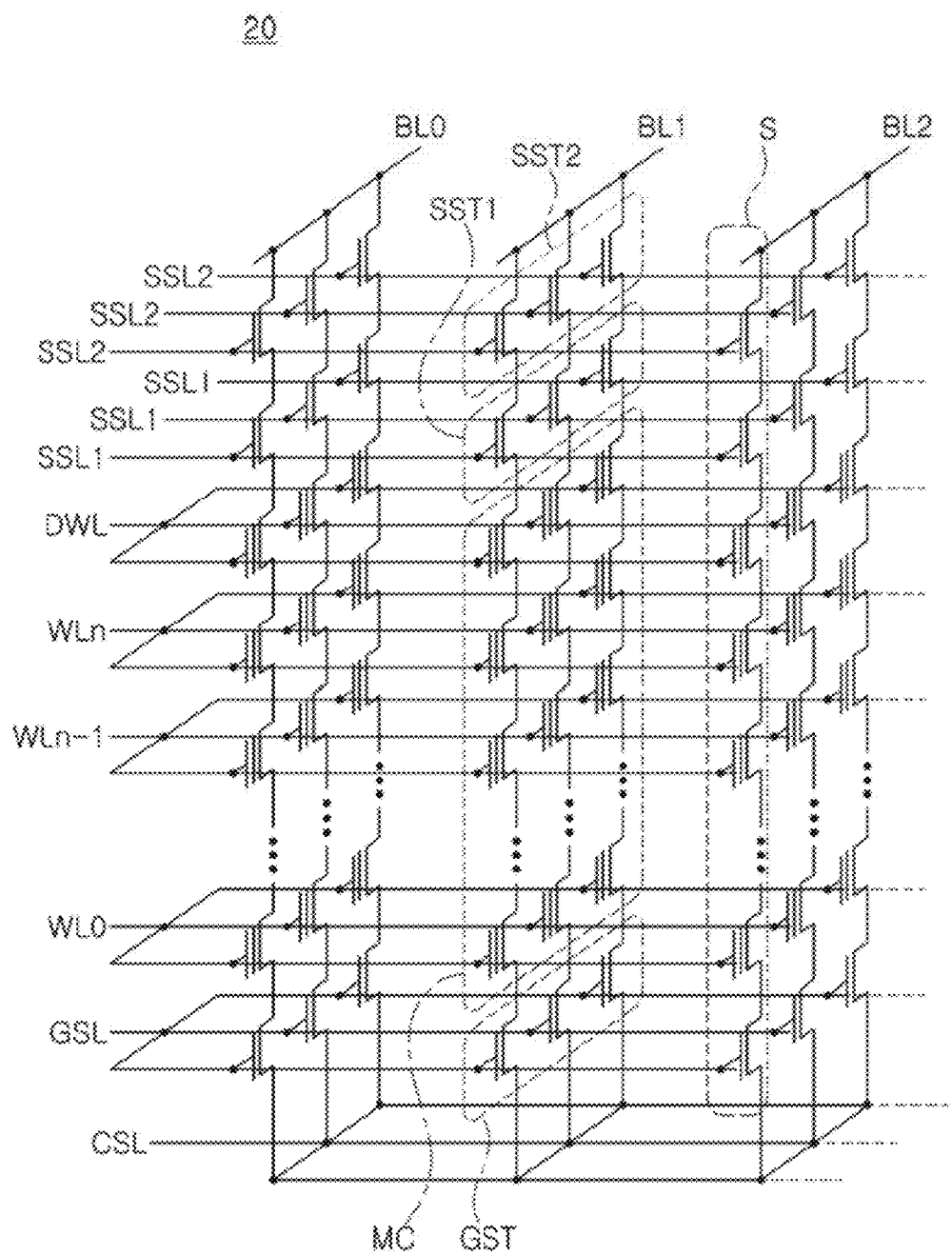
FIG. 2 is an equivalent circuit diagram illustrating a cell array of a semiconductor device according to an example embodiment of the present inventive concept.

FIG. 2 is an equivalent circuit diagram illustrating a cell array of a semiconductor device according to an example embodiment of the present inventive concept.

Referring to FIG. 2, a memory cell array 20 may include a plurality of memory cell strings S including memory cells MC connected to each other in series, a ground selection transistor GST, and string selection transistors SST1 and SST2 connected at opposite ends of the memory cells MC, in series. The plurality of memory cell strings S may be connected to bit lines BL0 to BL2 in parallel, respectively. The plurality of memory cell strings S may be connected to a common source line CSL in common. For example, the plurality of memory cell strings S may be disposed between the plurality of bit lines BL0 to BL2 and one common source line CSL. In example embodiments of the present inventive concept, a plurality of the common source lines CSL may be arranged two-dimensionally.

The memory cells MC, connected to each other in series, may be controlled by word lines WL0 to WLn for selecting the memory cells MC. Each of the memory cells MC may include a data storage factor. Gate electrodes of the memory cells MC disposed in the same distance from the common source line CSL may be connected in common to one of the word lines WL0 to WLn, and may be in an equipotential state. Alternatively, even when the gate electrodes of the memory cells MC are disposed in the same distance from the common source line CSL, gate electrodes disposed in different rows or columns may be controlled independently.

The ground selection transistor GST may be controlled by a ground selection line GSL, and may be connected to the common source line CSL. The string selection transistor SST may be controlled by the string selection lines SSL1 and SSL2, and may be connected to the bit lines BL0 to BL2. FIG. 2 illustrates an example in which one ground selection transistor GST and two string selection lines SSL1 and SSL2 are connected to each of the plurality of memory cells MC connected to each other in series, but the present invention is not limited thereto. One of the string selection lines SSL1 and SSL2 may be connected to each of the plurality of memory cells MC, or a plurality of ground selection transistors GST may be connected to each of the plurality of memory cells MC. One or more dummy lines DWL or a buffer line may be disposed between a highest word line WLn among the word lines WL0 to WLn and the string selection lines SSL1 and SSL2. In example embodiments of the present inventive concept, one or more dummy lines DWL may be disposed between a lowest word line WLn and the ground selection line GSL.

Once a signal is applied to the string selection transistors SST1 and SST2 via the string selection lines SSL1 and SSL2, a signal applied via the bit lines BL0 to BL2 may be transferred to the memory cells MC connected to each other in series, and an operation of reading out data and an operation of writing data may be performed accordingly. Also, by applying an erase voltage of a predetermined level through a substrate, an operation of erasing data recorded in the memory cells MC may be performed. In example embodiments of the present inventive concept, the memory cell array 20 may include at least one dummy memory cell string electrically separated from the bit lines BL0 to BL2.

Figure 3:
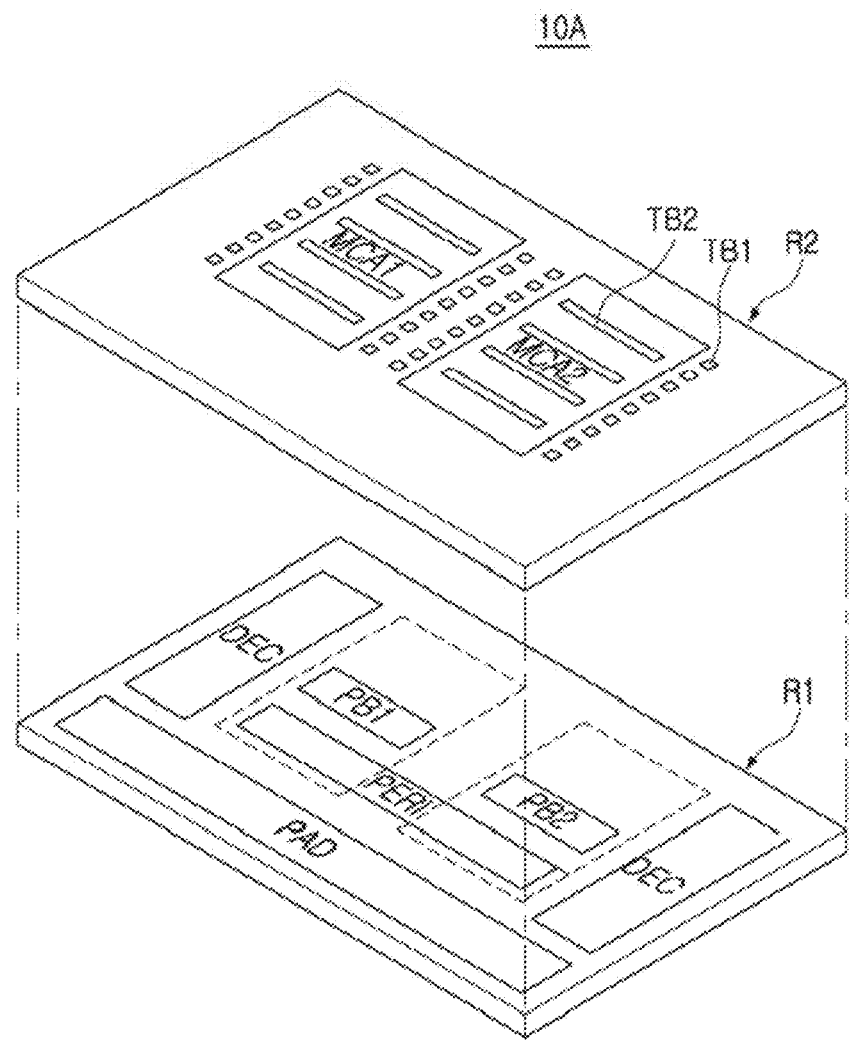
FIG. 3 is a diagram illustrating a layout of arrangement of a semiconductor device according to an example embodiment in the present inventive concept.

FIG. 3 is a diagram illustrating a layout of arrangement of a semiconductor device according to an example embodiment of the present inventive concept.

Referring to FIG. 3, a semiconductor device 10A may include first and second areas R1 and R2 stacked upon each other in a vertical direction. The first area R1 may form a peripheral circuit 30, and the second area R2 may form a memory cell array 20, as seen in FIG. 1.

The first area R1 may include a row decoder DEC, page buffers PB1 and PB2, a pad circuit PAD, and a peripheral circuit PERI. The second area R2 may include memory cell arrays MCA1 and MCA2, and first and second through wiring areas TB1 and TB2.

In the first area R1, the row decoder DEC may correspond to the row decoder 32 described above with reference to FIG. 1, and the page buffers PB1 and PB2 may correspond to the page buffer 34. Also, the peripheral circuit PERI may include the control logic 36 and the voltage generator 37 in FIG. 1, and may include a latch circuit, a cache circuit, or a sense amplifier, for example. The pad circuit PAD may include the input/output buffer 35 in FIG. 1, and may include an electrostatic discharge ESD or a data input/output circuit.

Some portions of the various circuit areas DEC, PB1, PB2, PERI and PAD in the first area R1 may be disposed in a lower portion of the memory cell arrays MCA1 and MCA2 in the second area R2. For example, as illustrated by a dotted line in FIG. 3, the page buffers PB1 and PB2 and the other peripheral circuit PERI may overlap with the memory cell arrays MCA1 and MCA2 in lower portions of the memory cell arrays MCA1 and MCA2. In example embodiments of the present inventive concept, however, the circuits included in the first area R1 and arrangement of the circuits may vary, and the circuits overlapped with the memory cell arrays MCA1 and MCA2 may also vary.

In the second area R2, the memory cell arrays MCA1 and MCA2 may be spaced apart from each other and disposed in parallel. The number and arrangement of the memory cell arrays MCA1 and MCA2 may vary. For example, in example embodiments of the present inventive concept, the memory cell arrays MCA1 and MCA2 may be disposed repeatedly and successively.

The first and second through wiring areas TB1 and TB2 may include a wiring structure penetrating through the second area R2 and connected to the first area R1. The first through wiring area TB1 may be disposed on both side portions of the memory cell arrays MCA1 and MCA2, and may include, for example, a wiring structure, such as a contact plug electrically connected to the row decoder DEC in the first area R1, and the like. The second through wiring area TB2 may be disposed at equal intervals within the memory cell arrays MCA1 and MCA2, and may include a wiring structure electrically connected to the page buffers PB1 and PB2 in the first area R1, for example. A higher number of first through wiring areas TB1 may be disposed than the second through wiring area TB2, and a shape, the number, an arrangement position, and the like, of the first and second through wiring areas TB1 and TB2 may vary in example embodiments of the present inventive concept.

Figure 4:
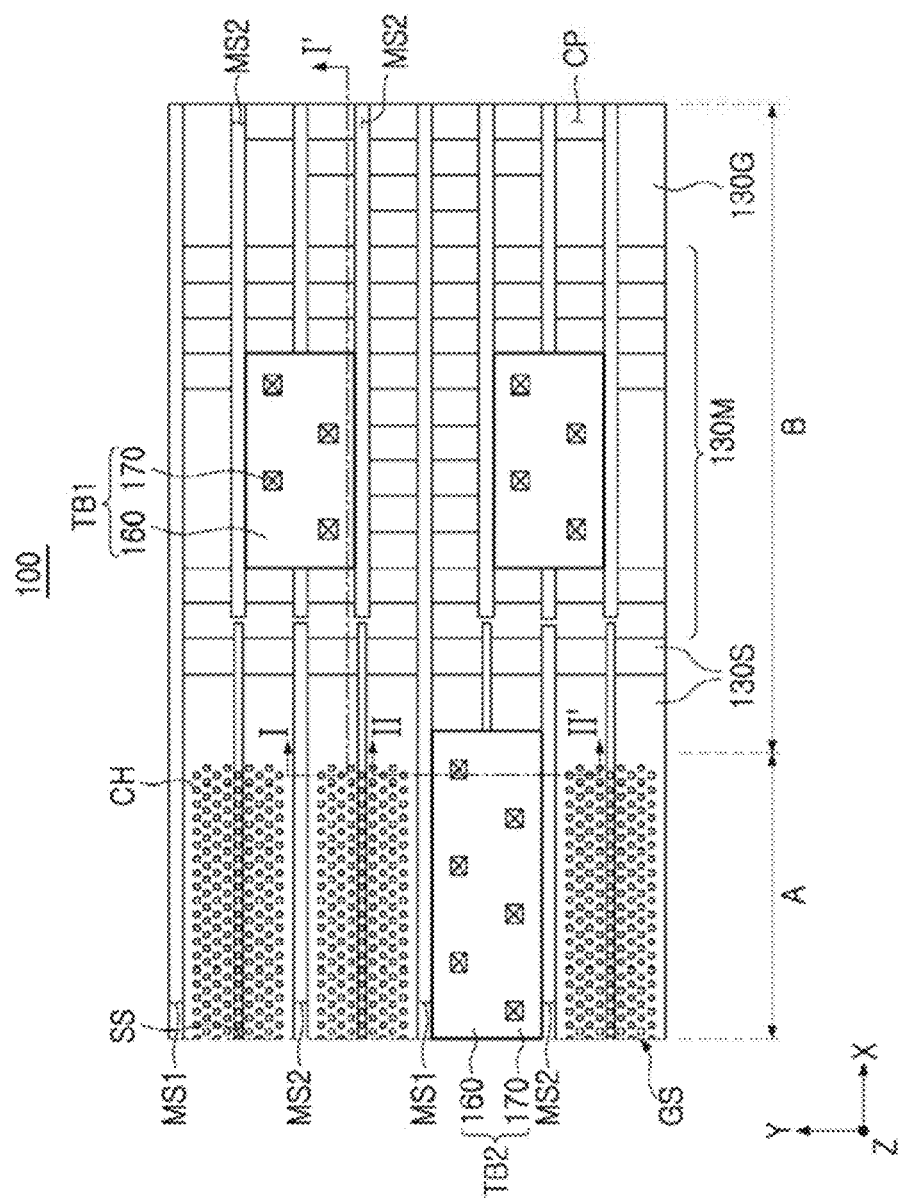
FIG. 4 is a top view illustrating a semiconductor device according to an example embodiment in the present inventive concept.

FIG. 4 is a top plan view illustrating a semiconductor device according to an example embodiment of the present inventive concept. FIG. 4 illustrates only main components of a semiconductor device 100 for ease of understanding.

Figure 5A:
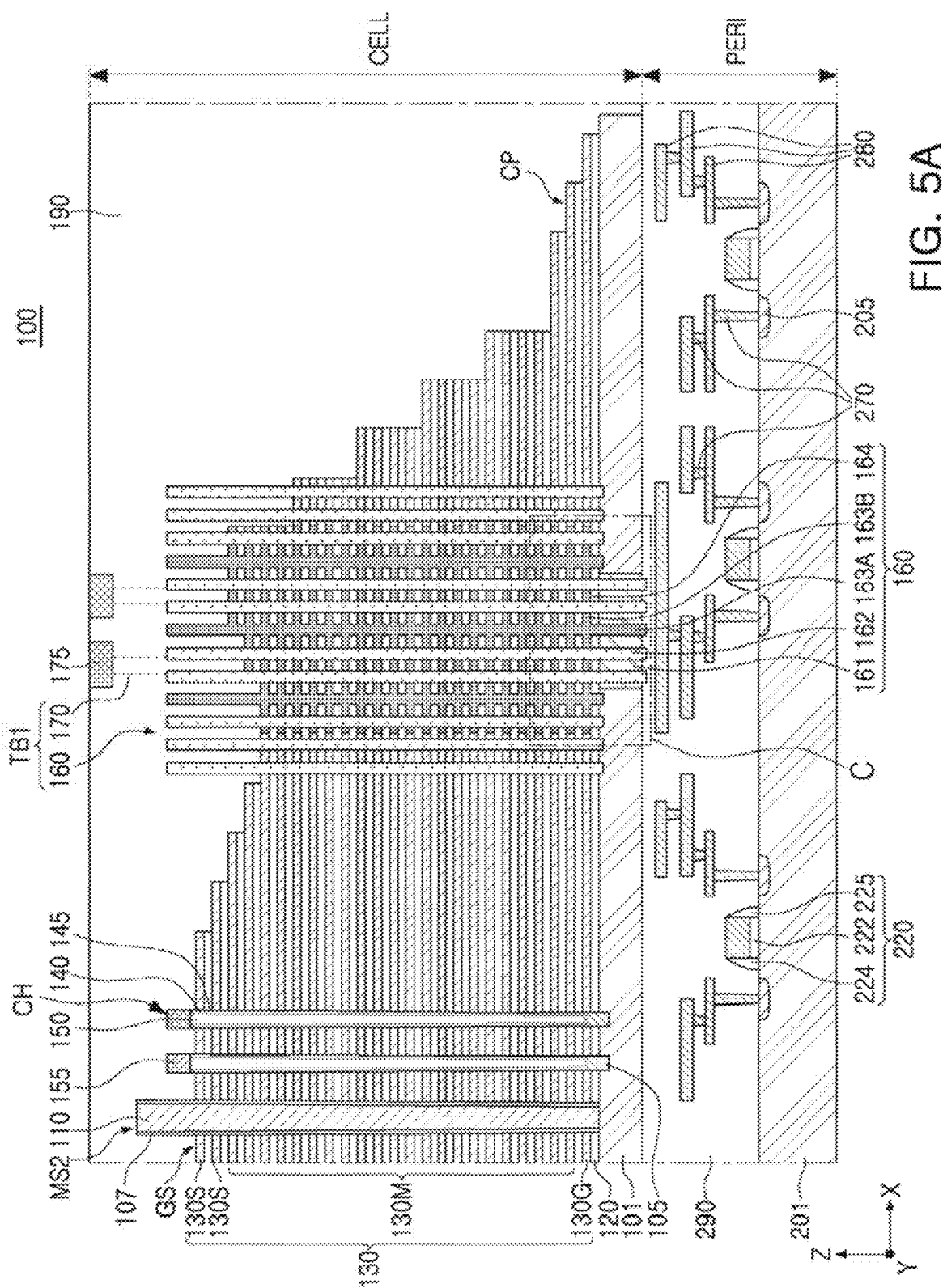
FIGS. 5A and 5B are schematic cross-sectional diagrams illustrating a semiconductor device according to an example embodiment in the present inventive concept.
Figure 5B:
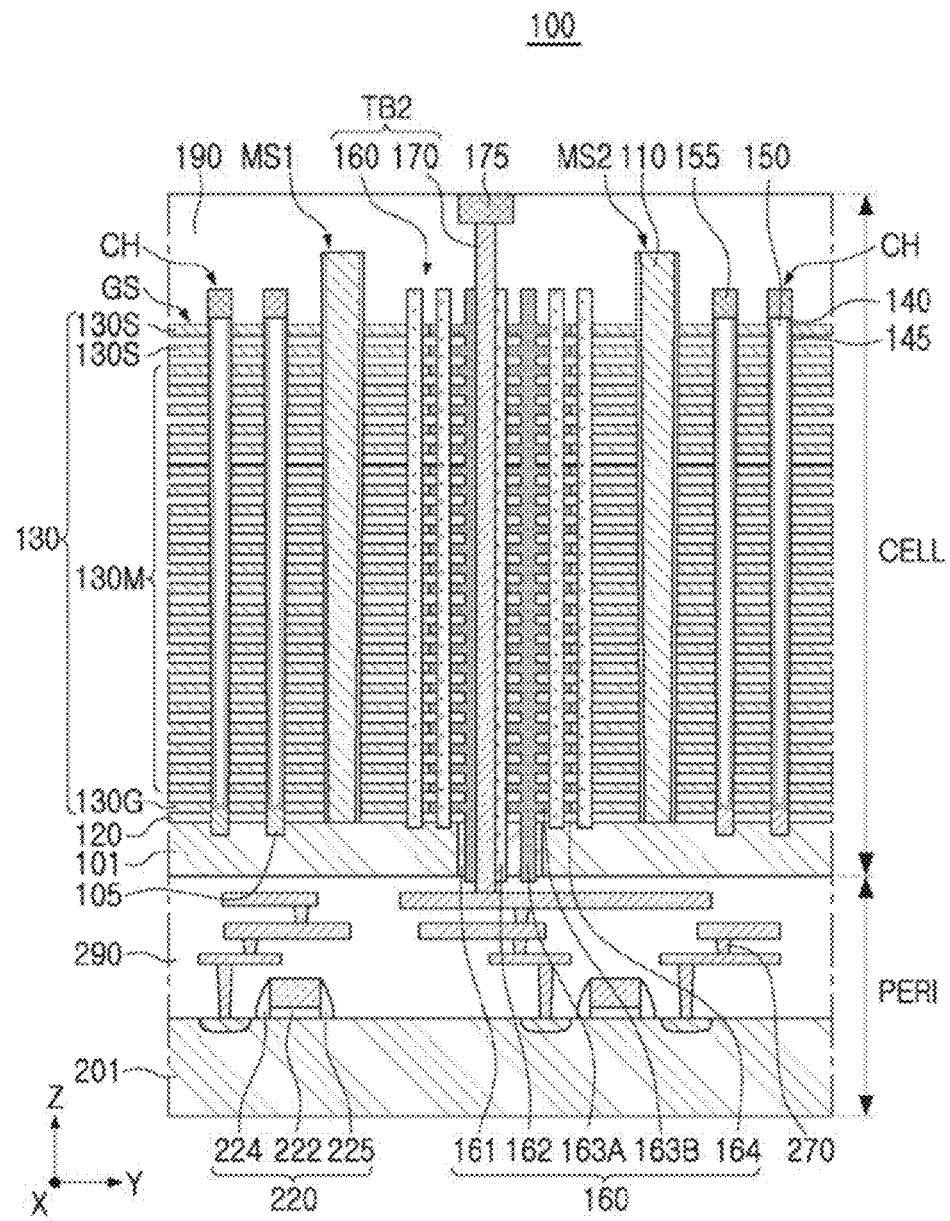

FIGS. 5A and 5B are schematic cross-sectional diagrams illustrating a semiconductor device according to an example embodiment of the present inventive concept. FIGS. 5A and 5B illustrate cross-sections taken along I-I' and II-II' in FIG. 4.

Referring to FIGS. 4 through 5B, the semiconductor device 100 may include a memory cell area CELL and a peripheral circuit area PERI. The memory cell area CELL may be disposed in an upper portion of the peripheral circuit area PERI. Alternatively, in example embodiments of the present inventive concept, the cell area CELL may be disposed in a lower portion of the peripheral circuit area PERI.

The memory cell area CELL may include a substrate 101 having a first area A and a second area B, gate electrodes 130 stacked on the substrate 101, first and second separation areas MS1 and MS2 extended through a stack structure GS of the gate electrodes 130, upper separate areas SS penetrating through a portion of the stack structure GS, channels CH penetrating through the stack structure GS, and first and second through wiring areas TB1 and TB2 penetrating through the stack structure GS and the substrate 101 and connected to a peripheral circuit area PERI. The memory cell area CELL may further include interlayer insulating layers 120 alternately stacked with the gate electrodes 130 on the substrate 101, a gate dielectric layer 145, a channel area 140 in the channels CH, a channel pad 155, a channel insulating layer 150, a wiring line 175, and a cell area insulating layer 190.

In the first area A in the substrate 101, gate electrodes 130 may be stacked vertically, and the channels CH may be disposed. The first area A may correspond to the memory cell array 20 in FIG. 1 and the memory cell arrays MCA1 and MCA2 in FIG. 3. In the second area B, the gate electrodes 130 may be extended by different lengths, and the second area B may electrically connect the memory cell array 20 and the peripheral circuit 30. The second area B may be disposed on at least one end of the first area A in at least one direction, for example, an X direction.

The substrate 101 may have an upper surface extended in an X direction and a Y direction. The substrate 101 may include a semiconductor material, such as a group IV semiconductor, a group III-V compound semiconductor, or a group II-VI compound semiconductor. For example, the group IV semiconductor may include silicon, germanium, or silicone-germanium. The substrate 101 may be provided as a bulk wafer or an epitaxial layer.

The gate electrodes 130 may be spaced apart and stacked vertically, and form the stack structure GS. The gate electrodes 130 may include a lower gate electrode 130G forming a gate of the ground selection transistor GST in FIG. 2, memory gate electrodes 130M forming the plurality of memory cells MC, and upper gate electrodes 130S forming a gate of string selection transistors SST1 and SST2. The number of memory gate electrodes 130M may be determined depending on a capacitance of the semiconductor device 100. According to various embodiments, the number of the string selection transistors SST1 and SST2 and the number of the upper and lower gate electrodes 130S and 130G of the ground selection line GSL may be one, or two or more, and the structures of the string selection transistors SST1 and SST2 and the upper and lower gate electrodes 130S and 130G may be the same as or different from the structure of the gate electrodes 130 of the memory cells MC. For example, some portions of the gate electrodes 130, the memory gate electrodes 130M adjacent to the upper and lower gate electrodes 130S and 130G, may be dummy gate electrodes.

The gate electrodes 130 may be spaced apart from each other and stacked vertically in the first area A, extended from the first area A to the second area B in different lengths, and form stepped portions in a staircase shape. The gate electrodes 130 may form stepped portions in an X direction as illustrated in FIG. 5A, and may form stepped portions on an end in a Y direction. By the stepped portions, the gate electrodes 130 in a lower portion may be extended in longer length than the gate electrodes 130 in an upper portion, such that the gate electrodes 130 may provide contact areas CP exposed to the upper portion. The gate electrodes 130 may be connected to separate contact plugs in the contact areas CP, and connected to wiring lines in the upper portion. Except for the upper and lower gate electrodes 130S and 130G among the gate electrodes 130, a certain number of the memory gate electrodes 130M, for example four memory gate electrodes 130M, may form a single stack structure, and a stepped portion may be formed between the stack structures. The four memory gate electrodes 130M forming a single stack structure may have stepped portions in a Y direction.

As illustrated in FIG. 4, the gate electrodes 130 may be separated from each other in a Y direction by the first separation area MS1 extended in an X direction. The gate electrodes 130 between a pair of the first separation areas MS1 may form a single memory block, but a range of the memory block is not limited thereto. For example, some portions of the gate electrodes 130, the memory gate electrodes 130M, may form a single layer within a single memory block.

The gate electrodes 130 may include a metal material such as tungsten (W). According to various embodiments, the gate electrodes 130 may include polycrystalline silicon, or a metal silicide material. In example embodiments of the present inventive concept, the gate electrodes 130 may further include a diffusion barrier, and the diffusion barrier may include, for example, tungsten nitride (WN), tantalum nitride (TaN), titanium nitride (TiN), or compounds thereof.

The interlayer insulating layers 120 may be disposed between the gate electrodes 130. As the gate electrodes 130, the interlayer insulating layers 120 may be spaced apart from each other in a direction perpendicular to a top surface of the substrate 101 and extended in an X direction. The interlayer insulating layers 120 may include an insulating material such as silicon oxide or silicon nitride.

The first and second separation areas MS1 and MS2 may penetrate through the gate electrodes 130 and may extend in an X direction in the first area A and the second area B. The first and second separation areas MS1 and MS2 may be parallel to each other. The first and second separation areas MS1 and MS2 may penetrate through the entire gate electrodes 130 stacked on the substrate 101 and may be connected to the substrate 101. In example embodiments of the present inventive concept, an arrangement order, the number, and the like, of the first and second separation areas MS1 and MS2 are not limited to the example illustrated in FIG. 4.

The common source line CSL, described above with reference to FIG. 2, may be disposed in the first separation areas MS1, A dummy common source line may be disposed in the second separation areas MS2. As illustrated in FIGS. 5A and 5B, a source insulating layer 107 and a source conductive layer 110 insulated from the gate electrodes 130 by the source insulating layer 107 may be disposed in the first and second separation areas MS1 and MS2. The source conductive layer 110 may be configured such that a width of the source conductive layer 110 is reduced towards the substrate 101 due to a high aspect ratio, but a shape of the source conductive layer 110 is not limited thereto. The source conductive layer 110 may have a side surface that is perpendicular to a top surface of the substrate 101. In example embodiments of the present inventive concept, an impurity region may be disposed on the substrate 101 in contact with the source conductive layer 110. The source conductive layer 110 in the first separation area MS1 may correspond to the common source line CSL, and the source conductive layer 110 in the second separation area MS2 may correspond to a dummy common source line. Thus, the source conductive layer 110 forming the second separation area MS2 might not be connected to devices driving the semiconductor device 100, or may be in a floating state in which an electrical signal is not applied.

The upper separation areas SS may be extended in an X direction between the first separation area MS1 and the second separation area MS2. The upper separation areas SS may be disposed in parallel to a portion of the second separation area MS2. The upper separation areas SS may be disposed in a portion of the second area B and the first area A to penetrate through some portions of the gate electrodes 130 including the upper gate electrodes 130S among the gate electrodes 130. The upper gate electrodes 130S separated by the upper separation areas SS may form different string selection lines SSL (see FIG. 2). The upper separation areas SS may include an insulating layer. The upper separation areas SS may separate three gate electrodes 130 in a Y direction, including the upper gate electrodes 130S, for example. The number of the gate electrodes 130 separated by the upper separation areas SS may vary. In example embodiments of the present inventive concept, the semiconductor device 100 may further include insulating layers separating the lower gate electrodes 130G among the gate electrodes 130. For example, the insulating layers may separate the lower gate electrodes 130G in an area between the second separation areas MS2 spaced apart from each other in a straight line in an X direction.

The channels CH may be spaced apart from each other to form rows and columns in the first area A. The channels CH may be disposed in a grid pattern or in zigzag lines in one direction. The channels CH may have a columnar shape, and may have a side surface narrowing towards the substrate 101 depending on an aspect ratio. In example embodiments of the present inventive concept, dummy channels may be further disposed on an end of the first area A adjacent to the second area B and in the second area B.

The channel area 140 may be disposed in the channels CH. The channel area 140 in the channels CH may have an annular shape surrounding an internal channel insulating layer 150, however a shape of the channel area 140 is not limited thereto. In various embodiments, the channel area 140 may have a column shape such as a cylinder or a prism without the channel insulating layer 150. A lower portion of the channel area 140 may be connected to an epitaxial layer 105. The channel area 140 may include a semiconductor material such as polycrystalline silicon or single crystal silicon, and the semiconductor material may a non-doped material, or may include p-type impurities or n-type impurities. The channels CH disposed in a straight line in a Y direction between the first separation area MS1 or the second separation area MS2 and the upper separation areas SS may be connected to different bit lines BL0 to BL2 (see FIG. 2) depending on arrangement of an upper wiring structure connected to the channel pad 155.

The channel pads 155 may be disposed in an upper portion of the channel area 140 in the channels CH. The channel pads 155 may cover a top surface of the channel insulating layer 150 and may be electrically connected to the channel area 140. The channel pads 155 may include, for example, doped polycrystalline silicon.

The gate dielectric layer 145 may be disposed between the gate electrodes 130 and the channel area 140. The gate dielectric layer 145 may include a tunneling layer, an electrical charge storing layer, and a blocking layer, stacked in the order stated from the channel area 140. The tunneling layer may perform a tunneling of an electrical charge to the electrical charge storing layer, and may include, for example, silicon oxide ($SiO_2$), silicon nitride ($Si_3N_4$), silicon oxynitride (SiON), or compounds thereof. The electrical charge storing layer may be an electrical charge trap layer or a floating gate conductive layer. The blocking layer may include silicon oxide ($SiO_2$), silicon nitride ($Si_3N_4$) silicon oxynitride (SiON), a high-k dielectric material, or compounds thereof. In example embodiments of the present inventive concept, at least a portion of the gate dielectric layer 145 may be extended in a horizontal direction along the gate electrodes 130.

The epitaxial layer 105 may be disposed on the substrate 101 on lower ends of the channels CH, and disposed on a side surface of at least one gate electrode 130. The epitaxial layer 105 may be disposed in a recessed area of the substrate 101. A height of an upper surface of the epitaxial layer 105 may be greater than a height of a top surface of the gate electrode 130 provided in a lowermost portion, and may be lower than a bottom surface of the gate electrode 130 provided on the upper surface, but the present invention is not limited thereto. In example embodiments of the present inventive concept, the epitaxial layer 105 may be omitted, and in this case, the channel area 140 may be directly connected to the substrate 101 or may be connected to a different conductive layer on the substrate 101.

The first and second through wiring areas TB1 and TB2 may include a wiring structure for connecting the memory cell area CELL and the peripheral circuit area PERI to each other. The first and second through wiring areas TB1 and TB2 may include a through contact plug 170 penetrating through the stack structure GS of the gate electrodes 130 and the substrate 101 and extended in a Z direction, and an insulating layer 160 surrounding the through contact plug 170. The first through wiring area TB1 may be disposed in the second area B, and one first through wiring area TB1 may be disposed in one memory blocks. The second through wiring area TB2 may be disposed in the first area A, and one second through wiring area TB2 may be disposed in one group of the plurality of memory blocks. The number, a size, arrangement, a shape, and the like, of the first and second through wiring areas TB1 and TB2 may be different in various example embodiments.

The gate electrode 130 might not be extended or disposed in the insulating area 160, and the insulating area 160 may be formed of an insulating material. The insulating area 160 may have a greater width in an upper portion of the substrate 101 than in the substrates 101, and may accordingly have a curved portion along a top surface and a side surface of the substrate 101. The insulating area 160 may include a first insulating layer 161 disposed on the same level as the substrate 101, second insulating layers 162 extended vertically to a top surface of the substrate 101, third insulating layers 163A and 163B disposed between the second insulating layers 162, and fourth insulating layers 164 positioned on the same level as the interlayer insulating layers 120.

The first insulating layer 161 may be disposed in an area in which the substrate 101 is partially removed, and may be surrounded by the substrate 101. The first insulating layer 161 may have a top surface that is coplanar with a top surface of the substrate 101, and a bottom surface of the first insulating layer 161 may be coplanar with a bottom surface of the substrate 101 or may be positioned on a level lower than the bottom surface of the substrate 101.

The second insulating layers 162 may be disposed on the first insulating layer 161, in a peripheral area of the first insulating layer 161. The second insulating layers 162 may function as a support structure when the third insulating layers 163A and 163B are formed. The second insulation layers 162 may have, for example, a cylindrical shape. Some portions of the second insulating layers 162 may penetrate through the first insulating layer 161 and may extend up to a lower portion of the first insulating layer 161, but the present invention is not limited thereto. For example, the second insulating layers 162 may partially penetrate through an upper portion of the first insulating layer 161. In various embodiments, the second insulating layers 162 may be extended onto a separate stop layer in a lower portion of the first insulating layer 161, or may be extended up to circuit wiring lines 280. The other portions of the second insulating layers 162 may be disposed on the substrate 101, and may partially recess the substrate 101. Some portions of the second insulating layers 162 disposed in an outermost portion among the second insulating layers 162 disposed on the substrate 101 may penetrate through the gate electrodes 130 in a peripheral area of the insulating area 160. These second insulating layers 162 may be disposed in the circumference of the insulating area 160, and may thus be referred to as a dummy insulating layer or a dummy structure.

The third insulating layers 163A and 163B may have vertical extension portions 163A extended vertically to a top surface of the substrate 101, and horizontal extension portions 163B extended from a side surface of the vertical extension portions 163A in a direction parallel to a top surface of the substrate 101 (for example, in an X direction). The vertical extension portion 163A may be disposed between the second insulating layers 162. The vertical extension portions 163A may have a line shape, but a shape of the vertical extension portions 163A is not limited thereto. The vertical extension portions 163A may have a circular shape or a square shape. Some portions of the vertical extension portions 163A may penetrate through the first insulating layer 161, and may extend up to a lower portion of the first insulating layer 161, but the present invention is not limited thereto. The vertical extension portions 163A may partially penetrate through an upper portion of the first insulating layer 161. Also, in various embodiments, the vertical extension portions 163A penetrating through the first insulating layer 161 may be extended onto a separate stop layer in a lower portion of the first insulating layer 161, or may be extended up to the circuit wiring lines 280. The other portions of the vertical extension portions 163A may be disposed on the substrate 101, and may recess a portion of the substrate 101. The horizontal extension portions 163B may be positioned on the same level as the gate electrodes 130, and may have a side surface that is in contact with the gate electrodes 130 on a boundary of the insulating area 160. However, when a portion of the gate dielectric layer 145 in the channels CH is disposed in the circumference of the gate electrodes 130 along the gate electrodes 130, the horizontal extension portions 163B may be in contact with the gate dielectric layer 145 on a boundary of the insulating area 160. In example embodiments of the present inventive concept, sizes of the second insulating layers 162 and the vertical extension portions 163A are not limited to the example illustrated in the diagrams, but may vary. For example, the sizes of the second insulating layers 162 and the vertical extension portions 163A may be greater than or smaller than sizes of the channels CH.

The fourth insulating layers 164 may fill spaces among the first to third insulating layers 161, 162, 163A and 163B. The fourth insulating layers 164 may be positioned on the same level as the interlayer insulating layers 120, and may be formed by extending the interlayer insulating layers 120. Thus, an area of the interlayer insulating layers 120 positioned within the insulating area 160 may form the fourth insulating layers 164.

The first to fourth insulating layers 161, 162, 163A, 163B and 164 forming the insulating area 160 may be formed of an insulating material. For example, the first to fourth insulating layers 161, 162, 163A, 163B and 164 may include silicon oxide or silicon oxynitride. As an example, even when the first to fourth insulating layers 161, 162, 163A, 163B and 164 are formed of the same material, material properties may be different depending on a formation process, a composition, and the like, and boundaries between the first to fourth insulating layers 161, 162, 163A, 163B and 164 may be distinct. The insulating layer 160 may have a first width, a width of the first insulating layer 161, in the substrate 101, and may have a second width, determined by the horizontal extension portions 163B and greater than the first width, on the substrate 101.

The through contact plug 170 may penetrate through the insulating layer 160 and be extended vertically to a top surface of the substrate 101, and may electrically connect the memory cell area CELL and circuit devices 220 in the peripheral circuit area PERI. However, the wiring structure electrically connecting the memory cell area CELL and the circuit devices 220 of the peripheral circuit area PERI is not limited to the through contact plug 170. An additional wiring structure may be disposed in an outer portion of the second area B, an area in which the substrate 101 is not disposed, and the like, for example. The through contact plug 170 may be connected to the wiring lines 175 in an upper portion thereof, but may alternatively be connected to a separate contact plug. The through contact plug 170 may be connected to the circuit wiring lines 280 in a lower portion thereof.

The through contact plug 170 may penetrate through the first insulating layer 161 in the insulating area 160, and may penetrate through at least some portions of the second to fourth insulating layers 162, 163A, 163B and 164 and may extended thereafter. For example, one through contact plug 170 may penetrate through the second insulating layer 162, the third insulating layers 163A and 163B, and portions of the fourth insulating layers 164, and may penetrate through the first insulating layer 161 in a lower portion. However, within the insulating area 160, arrangement of the through contact plug 170 may be determined irrespective of a position of the second insulating layer 162 and a position of the vertical extension portions 163A of the third insulating layers 163A and 163B. The number, form, and shape of the through contact plugs 170 disposed through one insulating area 160 may vary. According to example embodiments of the present inventive concept, the through contact plugs 170 may have a form in which a plurality of layers are connected. Also, according to example embodiments of the present inventive concept, a wiring structure may be further disposed in a form of a wiring line in addition to the through contact plugs 170. The through contact plugs 170 may include a conductive material, such as tungsten (W), copper (Cu), aluminum (Al), and the like, for example.

The wiring line 175 may form the wiring structure electrically connected to the memory cells in the memory cell area CELL. The wiring line 175 may be electrically connected to the gate electrodes 130 or the channels CH, for example. The number of contact plugs and wiring lines forming the wiring structure may vary. The wiring line 175 may include a metal, such as tungsten (W), copper (Cu), aluminum (Al), and the like, for example.

The cell area insulating layer 190 may cover the substrate 101, the gate electrodes 130 on the substrate 101, and a peripheral area insulating layer 290. The cell area insulating layer 190 may be formed of an insulating material.

The peripheral circuit area PERI may include a base substrate 201, circuit devices 220 disposed on the base substrate 201, circuit contact plugs 270, and circuit wiring lines 280.

The base substrate 201 may have a top surface extended in both an X direction and a Y direction. In the base substrate 201, separate device separation layers may be formed, such that an active area may be defined. In a portion of the active area, source/drain areas 205 including impurities may be disposed. The base substrate 201 may include a semiconductor material, such as a group IV semiconductor, a group III-V compound semiconductor, or a group II-VI compound semiconductor, for example.

The circuit devices 220 may include a planar transistor. Each of the circuit devices 220 may include a circuit gate dielectric layer 222, a spacer layer 224, and a circuit gate electrode 225. Within the base substrate 201 on both side surfaces of the circuit gate electrode 225, the source/drain areas 205 may be disposed.

The peripheral area insulating layer 290 may be disposed on the circuit device 220 on the base substrate 201. The circuit contact plugs 270 may penetrate through the peripheral area insulating layer 290 and be connected to the source/drain areas 205. An electrical signal may be applied to the circuit device 220 by the circuit contact plugs 270. The circuit contact plugs 270 may be connected to the circuit gate electrode 225. The circuit wiring lines 280 may be connected to the circuit contact plugs 270, and may be disposed in multiple layers.

Figure 6A:
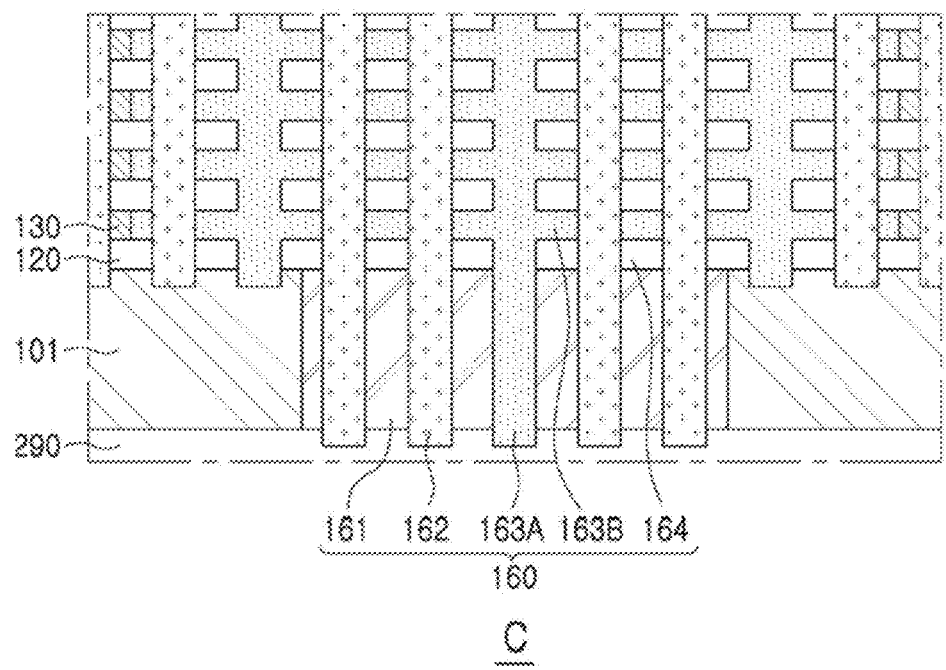
FIGS. 6A and 6B are diagrams illustrating a portion of a semiconductor device in magnified form according to an example embodiment in the present inventive concept.
Figure 6B:
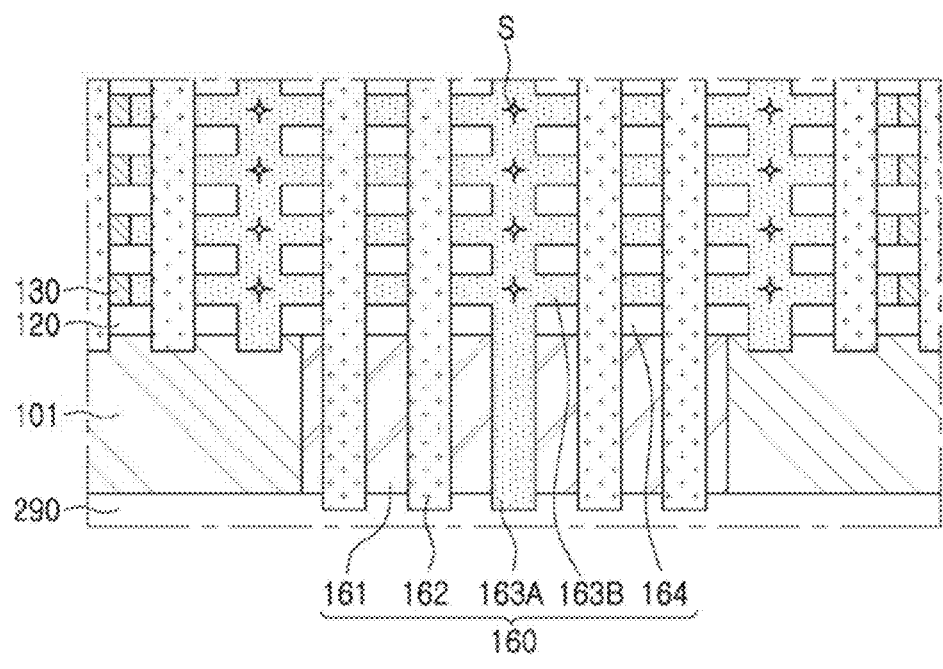

FIGS. 6A and 6B are diagrams illustrating a portion of a semiconductor device in magnified form according to an example embodiment of the present inventive concept. FIGS. 6A and 6B illustrate an area corresponding to area "C" in FIG. 5A in magnified form.

FIG. 6A illustrates first to fourth insulating layers 161, 162, 163A, 163B and 164 forming an insulating area 160. Some portions of the second insulating layers 162 and vertical extension portions 163A of the third insulating layers 163A and 163B may penetrate through the first insulating layer 161, and the other portions may be disposed on the substrate 101. Horizontal extension portions 163B of the third insulating layers 163A and 163B may be extended from a side surface of the vertical extension portions 163A and may be in contact with gate electrodes 130. The fourth insulating layer 164 extended from an interlayer insulating layer 120 may be disposed on top and bottom surfaces of the horizontal extension portions 163B.

Referring to FIG. 6B, the insulating area 160 may have a seam S in which the third insulating layers 163A and 163B are formed, unlike what is shown in FIG. 6A. For example, the seam S may be formed in an inner portion of areas in which the horizontal extension portions 163B are disposed. A shape and arrangement of the seam S may vary depending on widths of the vertical extension portions 163A and the horizontal extension portions 163B. For example, according to example embodiments of the present inventive concept, the seam S may be positioned in a central area of the vertical extension portions 163A and/or a central area of the horizontal extension portions 163B.

FIGS. 7A to 7D are diagrams illustrating a layout of a semiconductor device according to example embodiments of the present inventive concept. FIGS. 7A to 7D illustrate a layout of main layers in an insulating area 160.

Figure 7A:
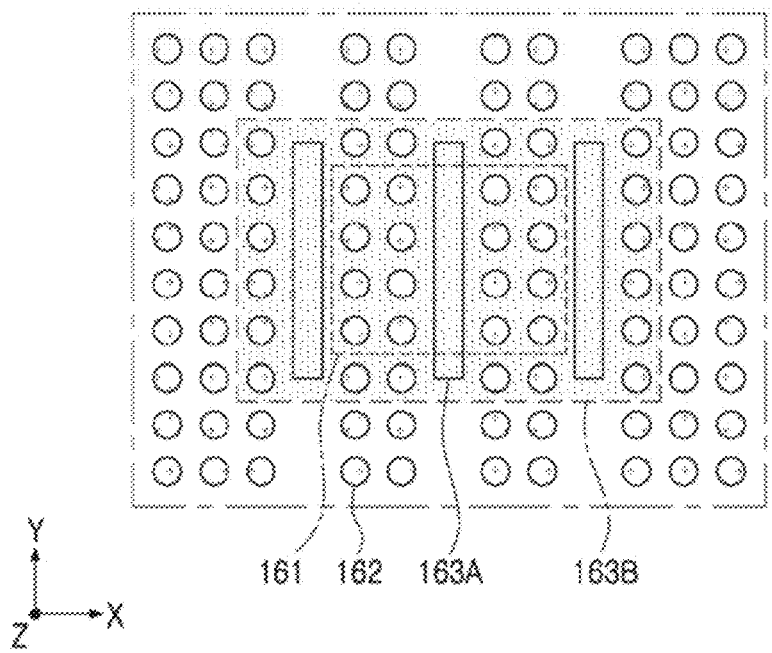
FIGS. 7A to 7D are diagrams illustrating a schematic layout of a semiconductor device according to an example embodiment in the present inventive concept.

Referring to FIG. 7A, second insulating layers 162 may form columns and rows at equal intervals in an area including an area in which a first insulating layer 161 is disposed. The second insulating layers 162 may have a circular shape, for example. The second insulating layers 162 may have a relatively large spacing distance to the second insulating layers 162 disposed in an area in which the vertical extension portion 163A of the third insulating layers 163A and 163B is disposed, adjacent to each other in an X direction. Some portions of the second insulating layers 162 disposed in an outer portion of the horizontal extension portion 163B of the third insulating layers 163A and 163B may be a dummy pattern penetrating through the gate electrodes 130 (see FIG. 5A).

The vertical extension portion 163A of the third insulating layers 163A and 163B may have a line shape that is extended in one direction, a Y direction, for example. The vertical extension portions 163A may be disposed at predetermined intervals in an X direction perpendicular to the extended direction within a boundary of the insulating area 160, for example, a boundary of the horizontal extension portion 163B.

Figure 7B:
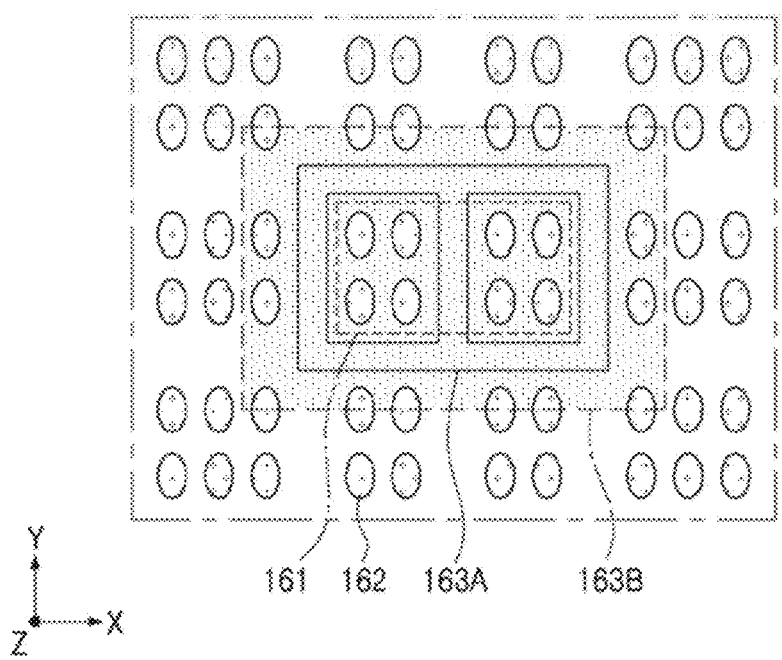

Referring to FIG. 7B, the second insulating layers 162 may have an oval shape, an elongated shape, or a bar shape on a plane, for example. The second insulating layers 162 may have a relatively large spacing distance to the second insulating layers 162 disposed in an area in which the vertical extension portion 163A of the third insulating layers 163A and 163B is disposed, adjacent to one another in an X direction and a Y direction.

Outer surfaces of the vertical extension portions 163A of the third insulating layers 163A and 163B may form a square, and may have a shape formed of a plurality of lines. For example, the vertical extension portions 163A may include a line pattern extended in an X direction and a line pattern extended in a Y direction within a boundary of the insulating area 160. According to example embodiments of the present inventive concept, the line pattern extended in an X direction and the line pattern extended in a Y direction might not be connected to each other, and the line patterns may be spaced apart from each other.

Figure 7C:
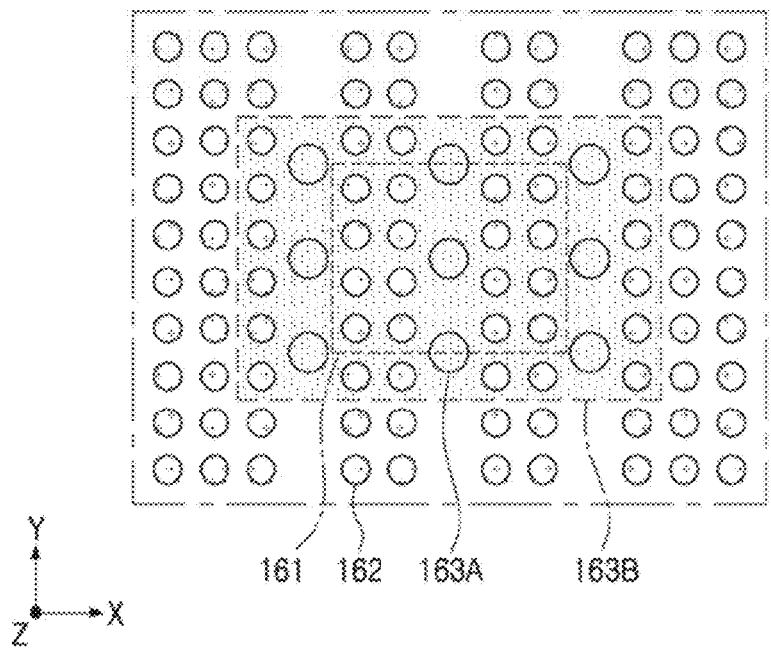

Referring to FIG. 7C, the second insulating layers 162 may form columns and rows in circular form as in FIG. 7A. The vertical extension portions 163A of the third insulating layers 163A and 163B may have a circular shape or an oval shape. The vertical extension portions 163A may be disposed at predetermined intervals in an X direction and a Y direction within a boundary of the insulating area 160, a boundary of the horizontal extension portions 163B.

Figure 7D:
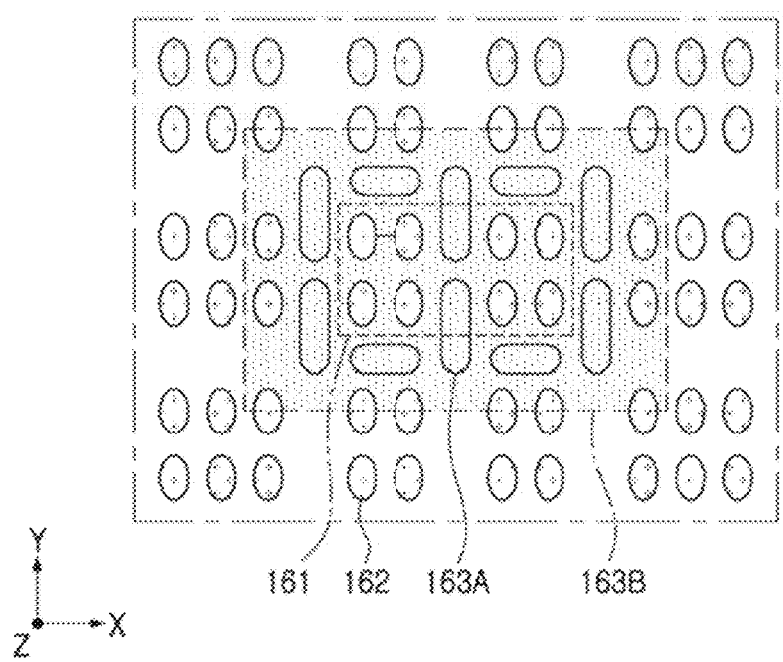

Referring to FIG. 7D, the second insulating layers 162 may form columns and rows in circular form as in FIG. 7A. The vertical extension portions 163A of the third insulating layers 163A and 163B may have a rectangular shape or an elongated shape. For example, the vertical extension portions 163A may include patterns extended in an X direction and patterns extended in a Y direction within a boundary of the insulating area 160, and the patterns may be spaced apart from each other.

As described above, according to example embodiments of the present inventive concept, the second insulating layers 162 and the third insulating layers 163A and 163B may have a variety of shapes, and it may be possible to combine the shapes of the second insulating layers 162 and the third insulating layers 163A and 163B as shown in FIGS. 7A to 7D.

Figure 8:
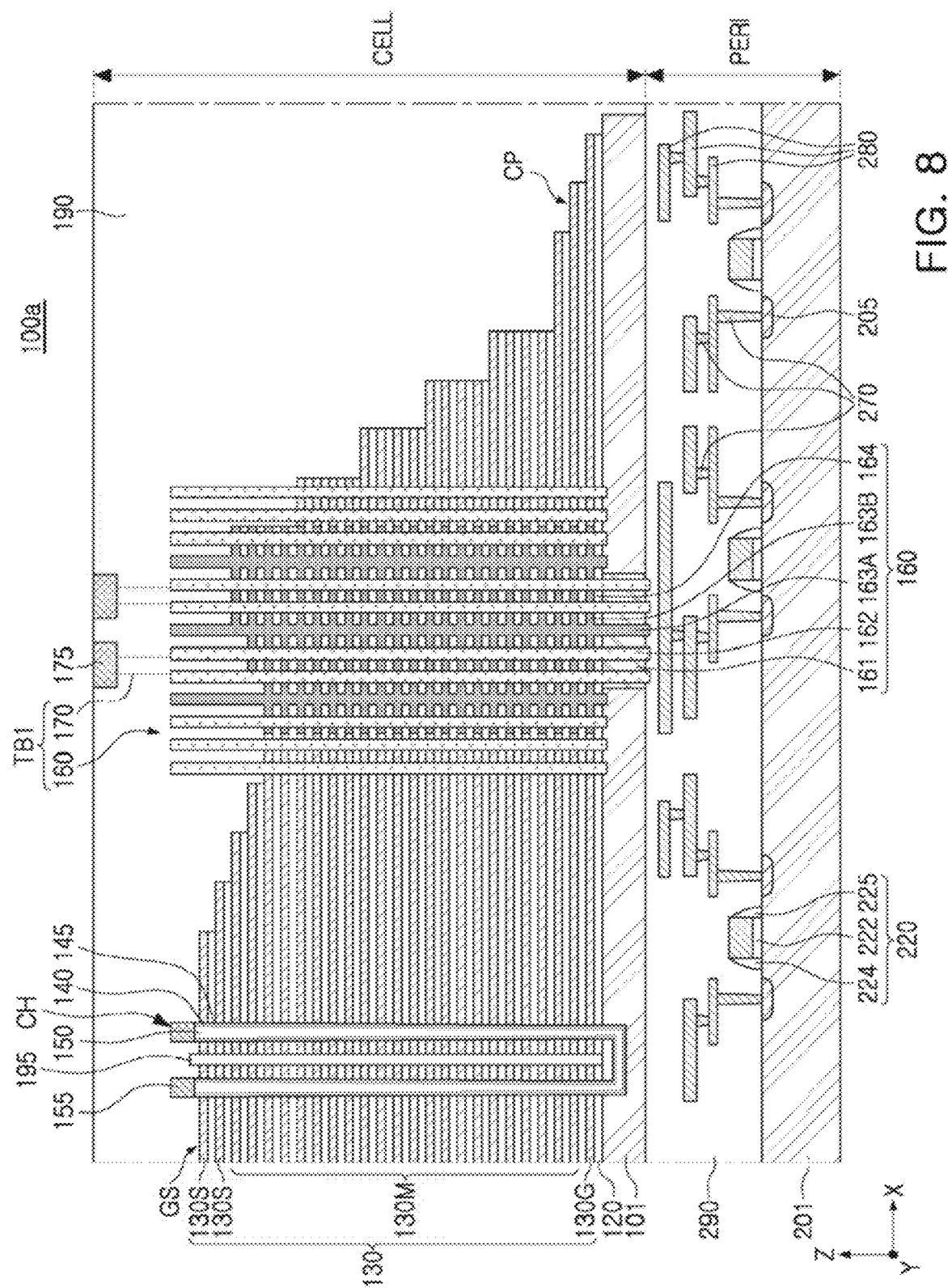
FIG. 8 is a schematic cross-sectional diagram illustrating a semiconductor device according to an example embodiment in the present inventive concept.

FIG. 8 is a schematic cross-sectional diagram illustrating a semiconductor device according to an example embodiment of the present inventive concept.

Referring to FIG. 8, in a semiconductor device 100a, channels CH may have a "U" shape that is different from what is shown in FIGS. 5A and 5B. The channels CH may penetrate through a stack structure GS of gate electrodes 130, and may have a curved shape within a substrate 101. The channels CH may include a channel area 140, a gate dielectric layer 145, a channel insulating layer 150, and a channel pad 155. The channel area 140, the gate dielectric layer 145, and the channel insulating layer 150 may be disposed in "U" form. A separation insulating layer 195 may be further disposed between the curved areas of the channels CH.

In the semiconductor device 100a, a source conductive layer 110 might not be extended to the substrate 101, unlike what is shown in FIG. 5A, and may be disposed on an end of the channel CH in an area not illustrated.

Figure 9:
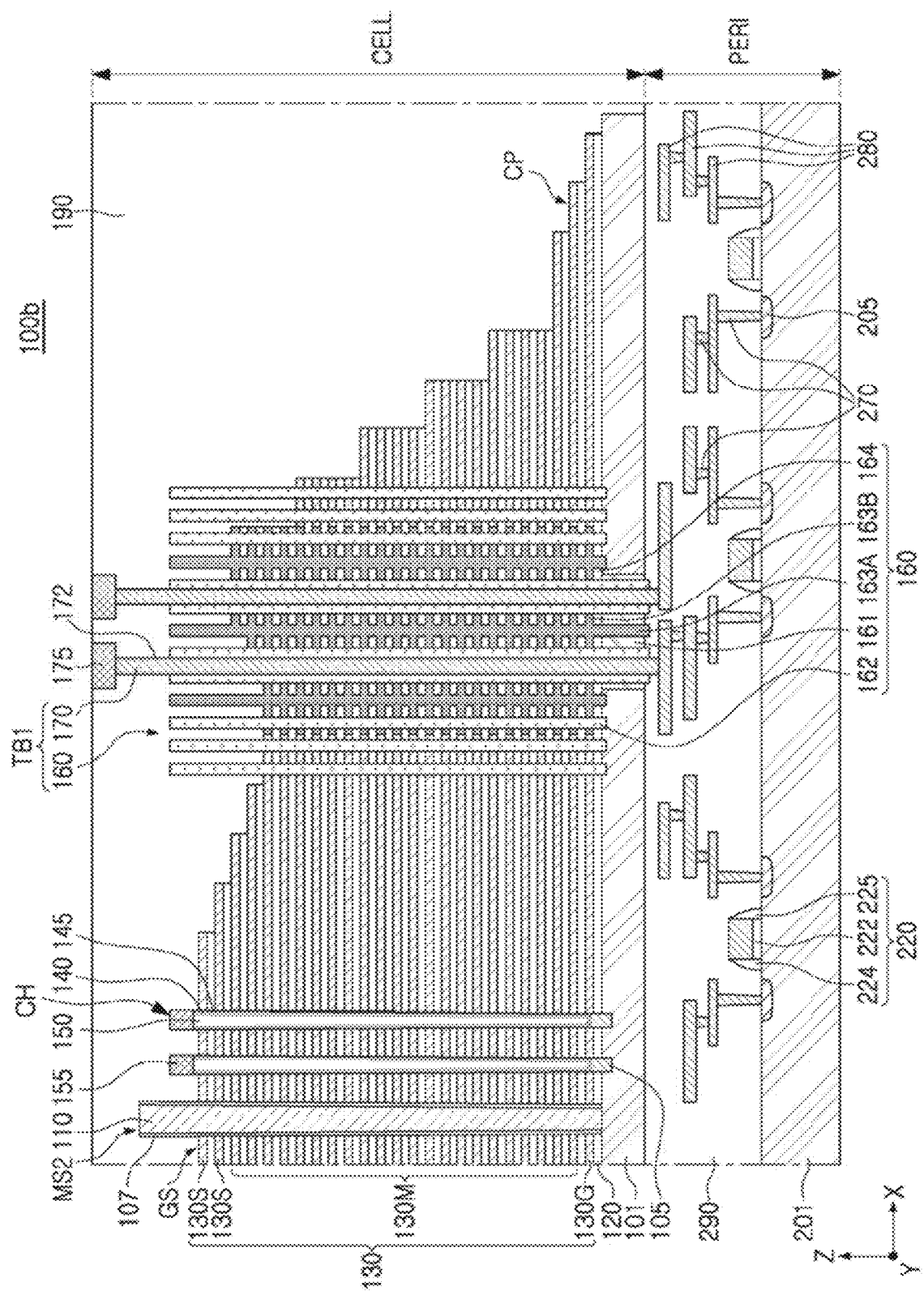
FIG. 9 is a schematic cross-sectional diagram illustrating a semiconductor device according to an example embodiment in the present inventive concept.

FIG. 9 is a schematic cross-sectional diagram illustrating a semiconductor device according to an example embodiment of the present inventive concept.

Referring to FIG. 9, the semiconductor device 100b may further include a wiring insulating layer 172 surrounding an outer surface of through contact plugs 170, unlike what is shown in FIGS. 5A and 5B.

The wiring insulating layer 172 may be disposed between the through contact plugs 170 and the insulating area 160. Thus, when a conductive area is partially disposed in the insulating area 160, or the insulating area 160 has a conductive layer therein, the through contact plugs 170 may be electrically separated from an area around the through contact plugs 170. Also, as in FIG. 6B, when a seam is partially formed in the insulating area 160, the through contact plugs 170 may be electrically separated from an area around the through contact plugs 170. The wiring insulating layer 172 may be extended into the substrate 101, and may also be extended into a peripheral area insulating layer 290. The wiring insulating layer 172 may be formed of an insulating material, such as a silicon oxide and/or a silicon nitride, for example.

Figure 10:
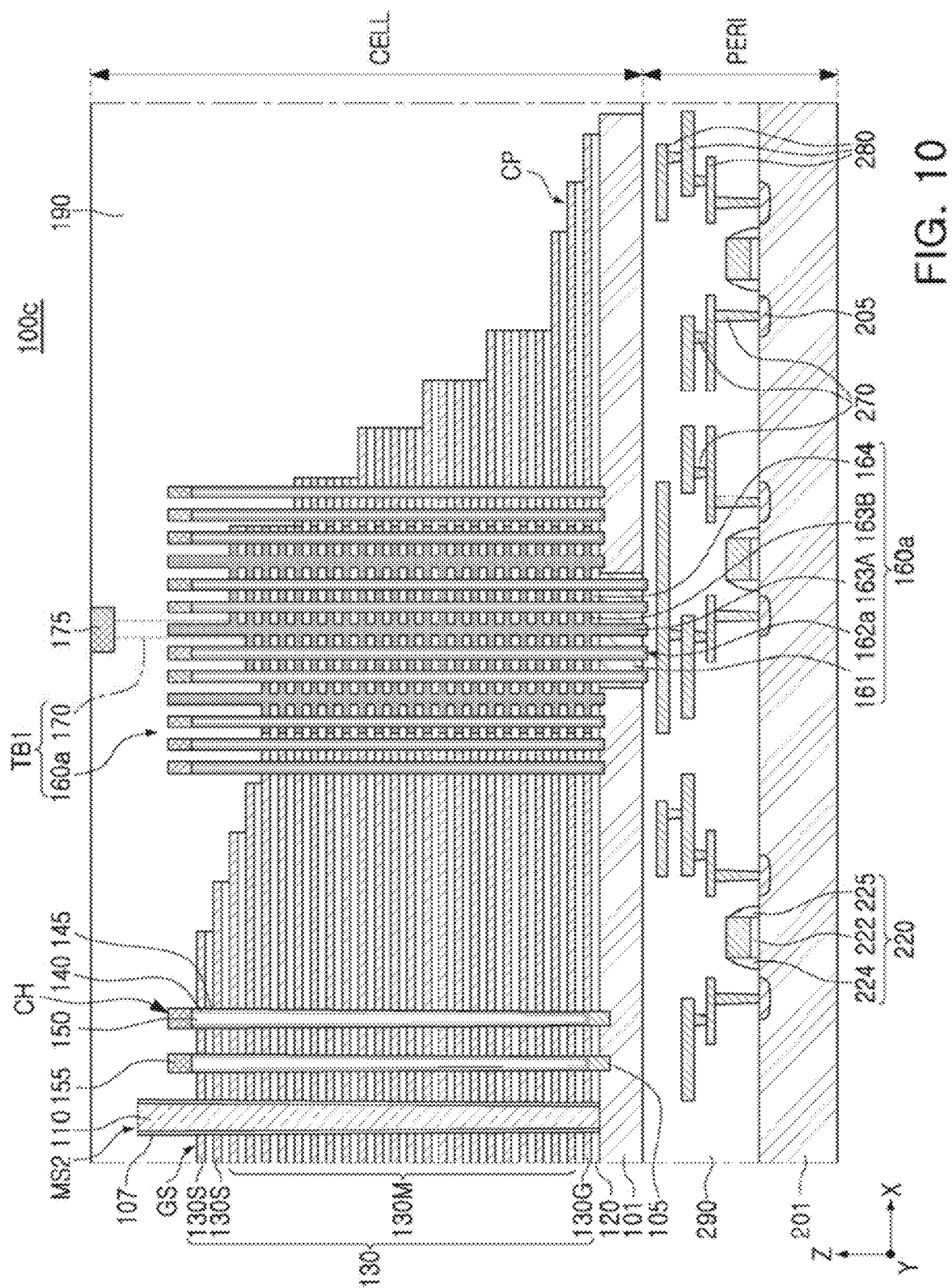
FIG. 10 is a schematic cross-sectional diagram illustrating a semiconductor device according to an example embodiment in the present inventive concept.

FIG. 10 is a schematic cross-sectional diagram illustrating a semiconductor device according to an example embodiment of the present inventive concept.

Referring to FIG. 10, in a semiconductor device 100c, a second insulating layer 162a forming an insulating area 160a may have the same structure as structures of channels CH. For example, the second insulating layer 162a may include layers corresponding to a gate dielectric layer 145, a channel area 140, a channel insulating layer 150, and a channel pad 155 therein, unlike what is shown in FIGS. 5A and 5B. For example, the second insulating layer 162a may include a conductive material such as the channel area 140 and the channel pad 155. The structure of the second insulating layer 162a may be obtained by forming the second insulating layer 162a and the channel CH together.

In this case, as illustrated, a through contact plug 170 might not penetrate through the second insulating layer 162a. Alternatively, as is described above with reference to FIG. 9, the through contact plug 170 may be electrically separated from the second insulating layer 162a by further disposing a wiring insulating layer 172 surrounding a side wall of the through contact plug 170.

FIG. 11A to 11J are schematic cross-sectional diagrams illustrating a method of manufacturing a semiconductor device according to an example embodiment of the present inventive concept. FIGS. 11A to 11J illustrate areas corresponding to the areas illustrated in FIG. 5A.

Referring to 11A, a peripheral circuit area PERI including circuit devices 220 and lower wiring structures may be formed on a base substrate 201, and a substrate 101 on which a memory cell area is provided and a first insulating layer 161 may be formed in an upper portion of the peripheral circuit area PERI.

A circuit gate dielectric layer 222 and a circuit gate electrode 225 may be formed sequentially on the base substrate 201. The circuit gate dielectric layer 222 and the circuit gate electrode 225 may be formed through an atomic layer deposition (ALD) process, or a chemical vapor deposition (CVD) process. The circuit gate dielectric layer 222 may be formed of silicon oxide, and the circuit gate electrode 225 may be formed of a polycrystalline silicon and/or a metal silicide layer. However, materials of the circuit gate dielectric layer 222 and the circuit gate electrode 225 are not limited thereto. Thereafter, a spacer layer 224 and source/drain areas 205 may be formed on both side walls of the circuit gate dielectric layer 222 and the circuit gate electrode 225. In various embodiments, the spacer layer 224 may have a plurality of layers. The source/drain areas 205 may then be formed by performing an ion implantation process.

The circuit contact plugs 270 among the lower wiring structures may be formed by partially forming a peripheral area insulating layer 290, partially etching and removing the peripheral area insulating layer 290, and filling the area of the removed portion with a conductive material. Lower wiring lines 280 may be formed by depositing a conductive material and patterning the deposited conductive material, for example.

The peripheral area insulating layer 290 may be configured with a plurality of insulating layers. The peripheral area insulating layer 290 may be partially formed in processes in which the lower wiring structures are formed, and partially formed in an upper portion of the lower wiring lines 280 in an uppermost portion, and may accordingly cover the circuit devices 220 and the lower wiring structures.

The substrate 101 may be formed on the peripheral area insulating layer 290. The substrate 101 may be formed of polycrystalline silicon, for example, and may be formed by a CVD process. The polycrystalline silicon forming the substrate 101 may include various impurities. The substrate 101 may be smaller than the base substrate 201, but a size of the substrate 101 is not limited thereto.

The first insulating layer 161 may be formed by partially removing the substrate 101 in areas corresponding to first and second through wiring areas TB1 and TB2 and filling the areas of the removed portions with an insulating material. After filling the removed portions with the insulating material, a planarization process may be performed using a chemical mechanical polishing (CMP) process. Accordingly, a top surface of the first insulating layer 161 may be coplanar with a top surface of the substrate 101.

Referring to 11B, sacrificial layers 180 and interlayer insulating layers 120 may be alternately stacked on the substrate 101, and the sacrificial layers 180 and the interlayer insulating layers 120 may be partially removed to allow the sacrificial layers 180 to be extended by different lengths in an X direction.

The sacrificial layers 180 may be replaced with gate electrodes 130 (see FIG. 5A) through a subsequent process. The sacrificial layers 180 may be formed of a material different from a material of the interlayer insulating layers 120, and may be formed of a material able to be etched with an etching selectivity to the interlayer insulating layers 120 in specific etching conditions. For example, the interlayer insulating layers 120 may be formed of silicon oxide and/or silicon nitride. The sacrificial layers 180 may be formed of a material different from a material of the interlayer insulating layers 120, such as silicon, silicon oxide, silicon carbide, and/or silicon nitride. In example embodiments of the present inventive concept, thicknesses of the interlayer insulating layers 120 may be different. For example, a thickness of the interlayer insulating layers 120 in a lowermost portion may be relatively thin, and a thickness of the interlayer insulating layers 120 in an uppermost portion may be relatively thick. Thicknesses and the number of layers of the interlayer insulating layers 120 and the sacrificial layers 180 may vary and may be different from what is illustrated.

In the second area B in FIG. 4, a photolithography process and an etching process may be repeatedly performed on the sacrificial layers 180 using a mask layer to allow the sacrificial layers 180 in an upper portion to have a shorter length than the sacrificial layers 180 in a lower portion. Accordingly, the sacrificial layers 180 may form a staircase shape, and a contact area CP may be provided. The sacrificial layers 180 may include an upper stack ST1, an intermediate stack ST2, and a lower stack ST3. The upper stack ST1 may include a dummy stack on a boundary between the upper stack ST1 and the intermediate stack ST2, and the number of the sacrificial layers 180 forming the intermediate stack ST2 may be adjusted depending on the number of the gate electrodes 130 to be formed. The upper stack ST1 and the lower stack ST3 may be lowered by a first stepped portion in an X direction, and the intermediate stack ST2 may be lowered by a second stepped portion higher than the first stepped portion. In example embodiments of the present inventive concept, the number of the sacrificial layers 180 forming the stacks ST1, ST2 and ST3 and sizes of the stepped portions may vary.

Thereafter, a first cell area insulating layer 192 covering an upper portion of a stack structure of the sacrificial layers 180 and the interlayer insulating layers 120 may be formed.

Figure 11A:
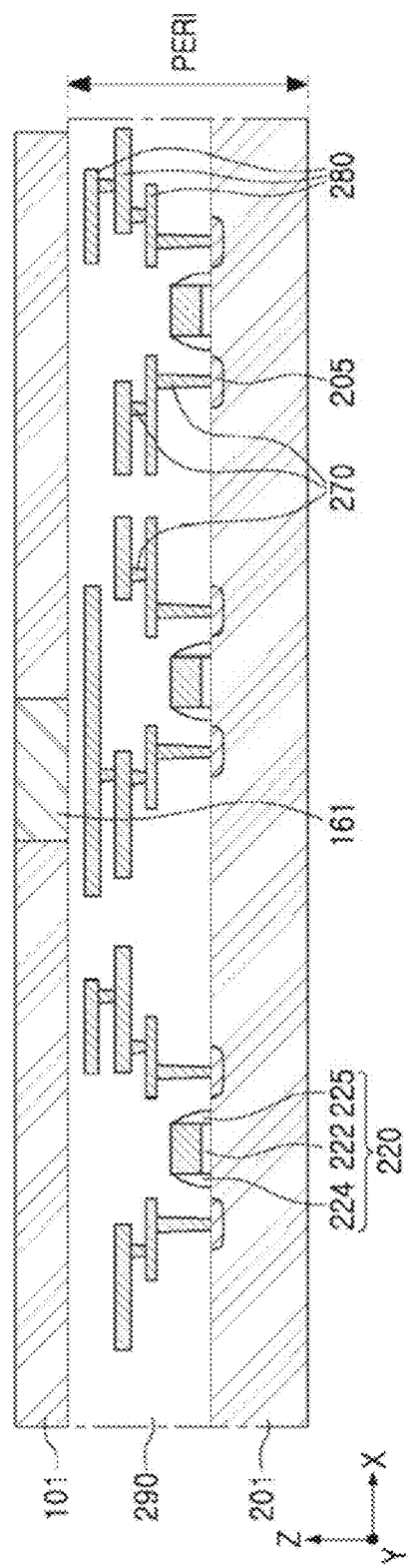
FIGS. 11A to 11J are schematic cross-sectional diagrams illustrating a method of manufacturing a semiconductor device according to an example embodiment in the present inventive concept.
Figure 11B:
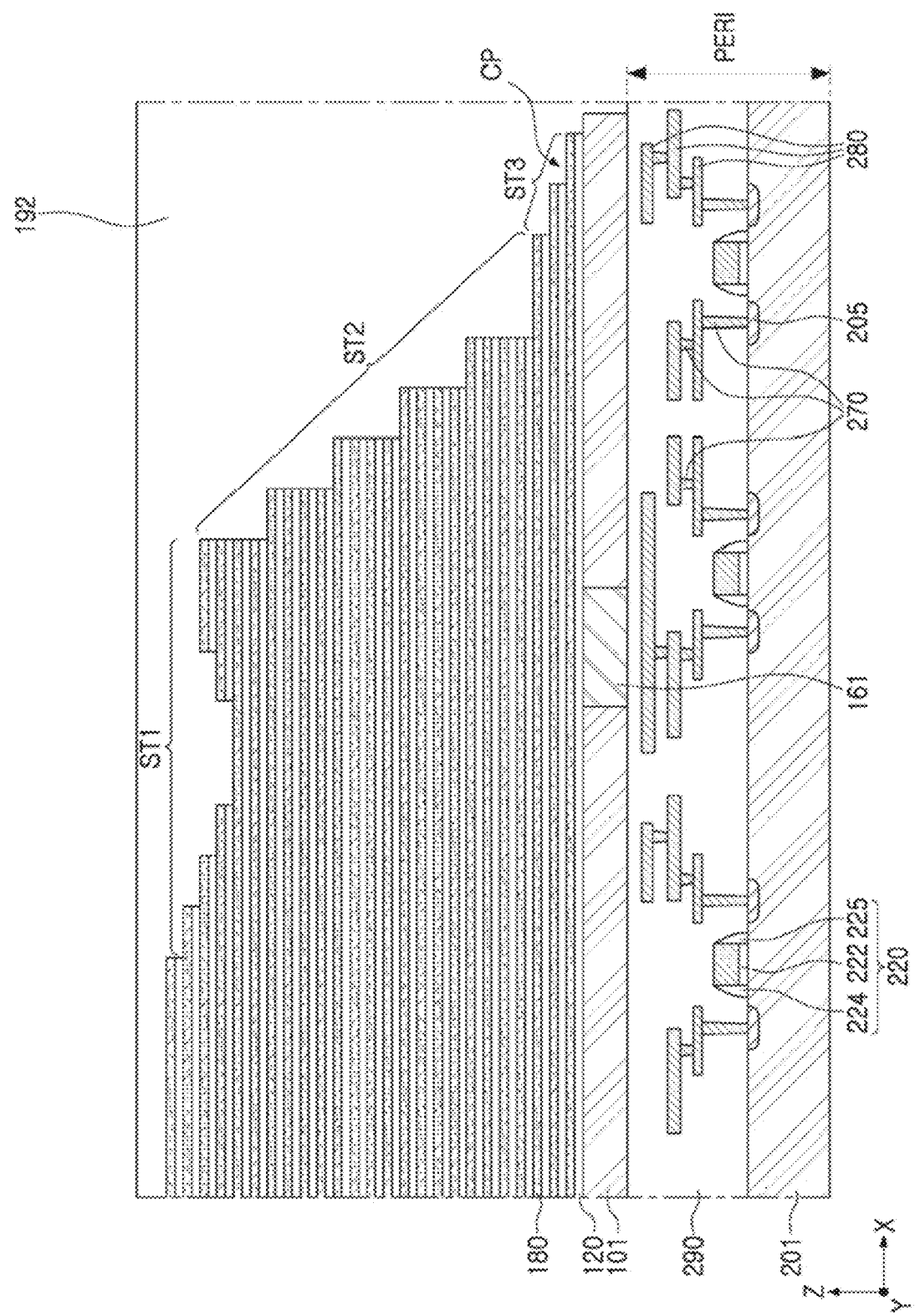
Figure 11C:
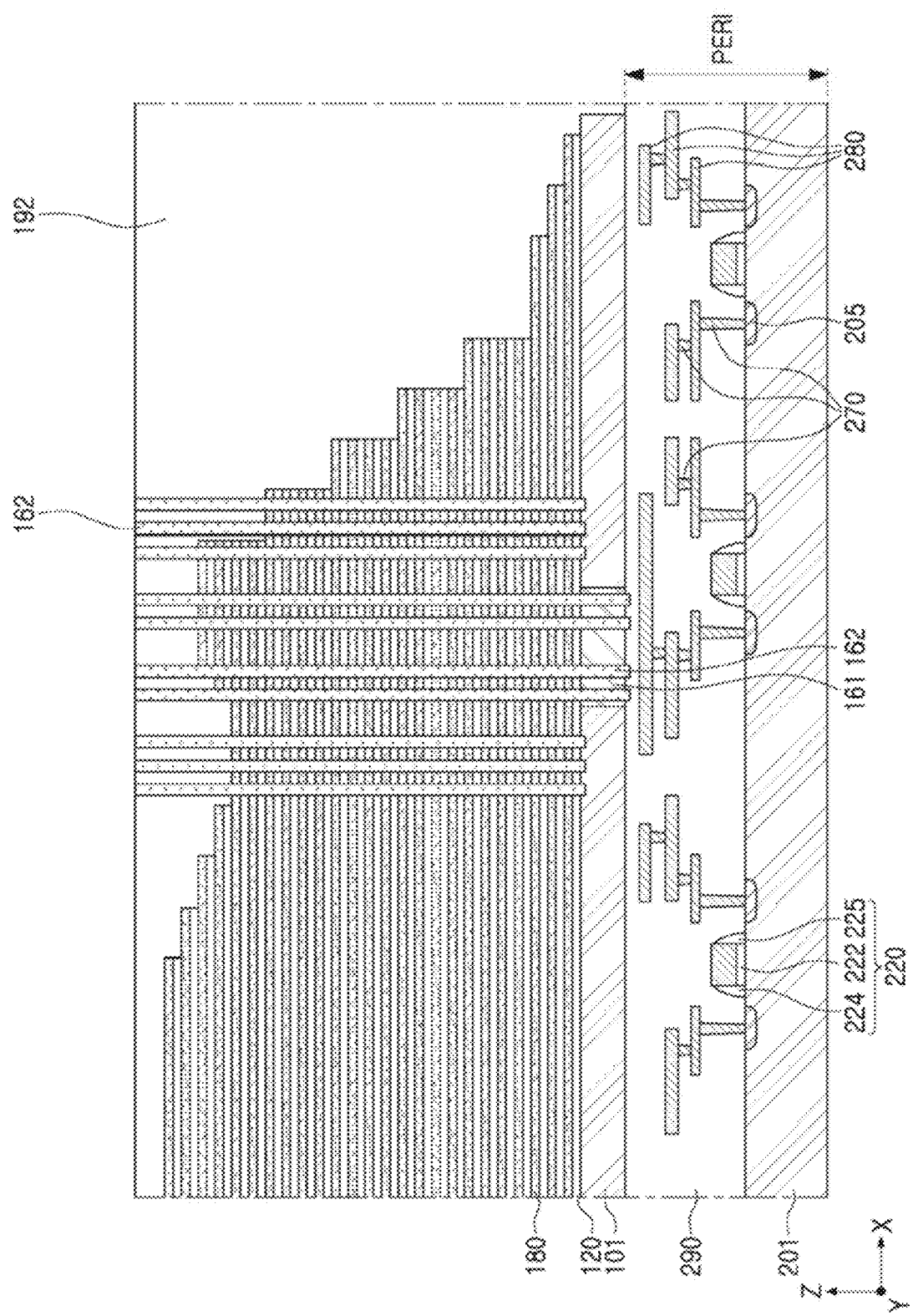

Referring to FIG. 11C, second insulating layers 162 penetrating through the stack structure of the sacrificial layers 180 and the interlayer insulating layers 120 may be formed.

The second insulating layers 162 may be formed at equal intervals in an area including a first insulating layer 161. The second insulating layers 162 may be formed by partially removing the first cell area insulating layer 192, the sacrificial layers 180, and the interlayer insulating layers 120 to form an opening, and filling the opening with an insulating material. A material of the second insulating layers 162 may be different from a material of the sacrificial layers 180.

Some portions of the second insulating layers 162 may penetrate through the first insulating layer 161 and may be extended into the peripheral area insulating layer 290. In this case, a depth to which the second insulating layers 162 are extended may be controlled using a separate etching stop layer disposed in the peripheral area insulating layer 290. Alternatively, the second insulating layers 162 may be extended to circuit wiring lines 280 using the circuit wiring lines 280 as an etching stop layer. Some portions of the second insulating layers 162 may be recessed at an upper portion of the substrate 101 in a peripheral area of the first insulating layer 161. Some of the second insulating layers 162 disposed in an outermost portion among the second insulating layers 162 may be a dummy structure for patterning the other second insulating layers 162. The second insulating layers 162 may have a sloped side surface depending on a height of a stack structure of the sacrificial layers 180 and the interlayer insulating layers 120.

Figure 11D:
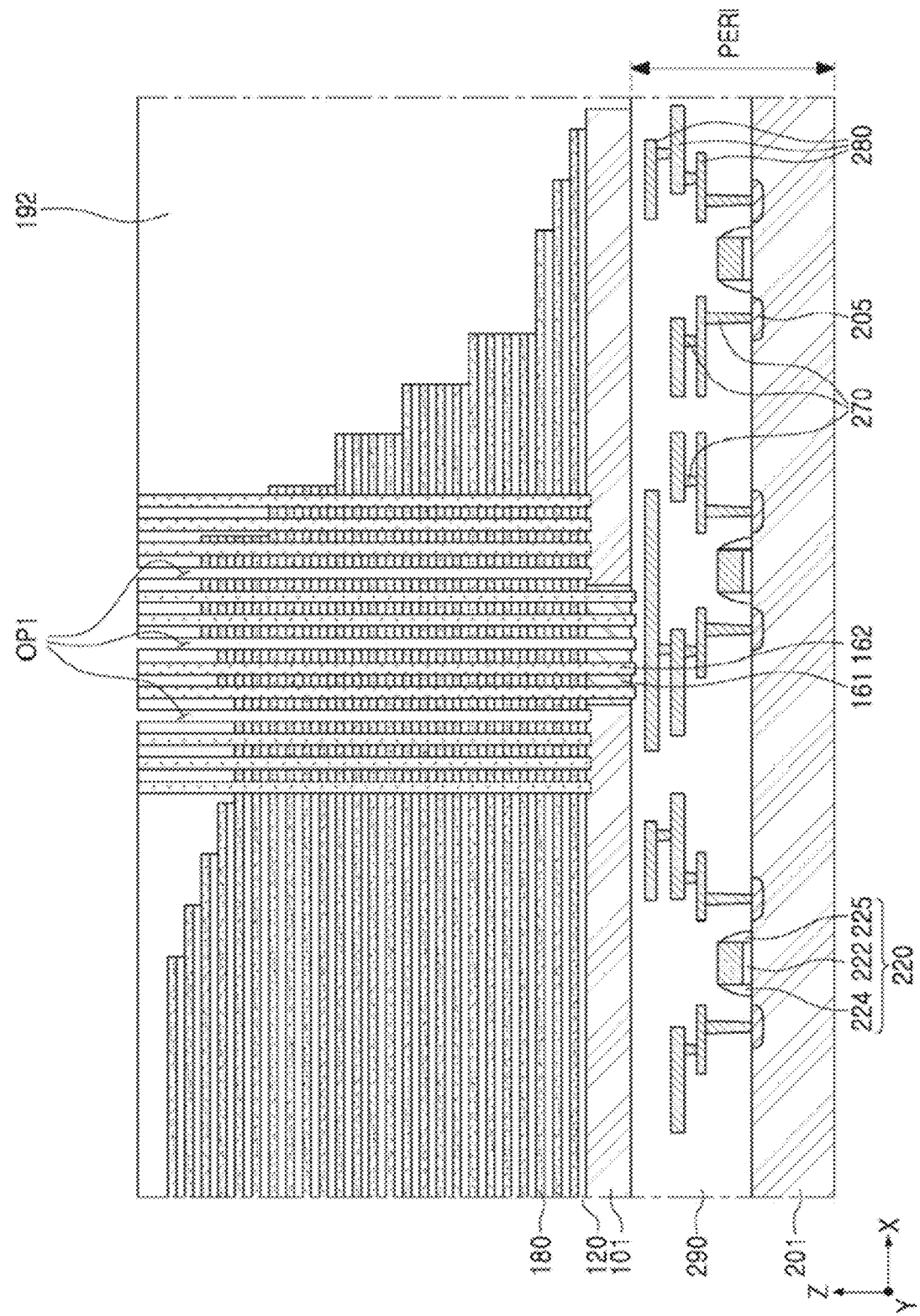

Referring to FIG. 11D, first openings OP1 penetrating through the stack structure of the sacrificial layers 180 and the interlayer insulating layers 120 may be formed.

The first openings OP1 may be formed by removing the first cell area insulating layer 192, the sacrificial layers 180, and the interlayer insulating layers 120 in an area corresponding to the vertical extension portions 163A of the third insulating layers 163A and 163B in FIG. 5A. The first openings OP1 may be formed at equal intervals between the second insulating layers 162. Some of the first openings OP1 may penetrate through the first insulating layer 161 and may be extended into the peripheral area insulating layer 290. Some of the first openings OP1 may recess an upper portion of the substrate 101 in a peripheral area of the first insulating layer 161. The first openings OP1 may have a sloped side surface depending on a height of the stack structure of the sacrificial layers 180 and the interlayer insulating layers 120

Figure 11E:
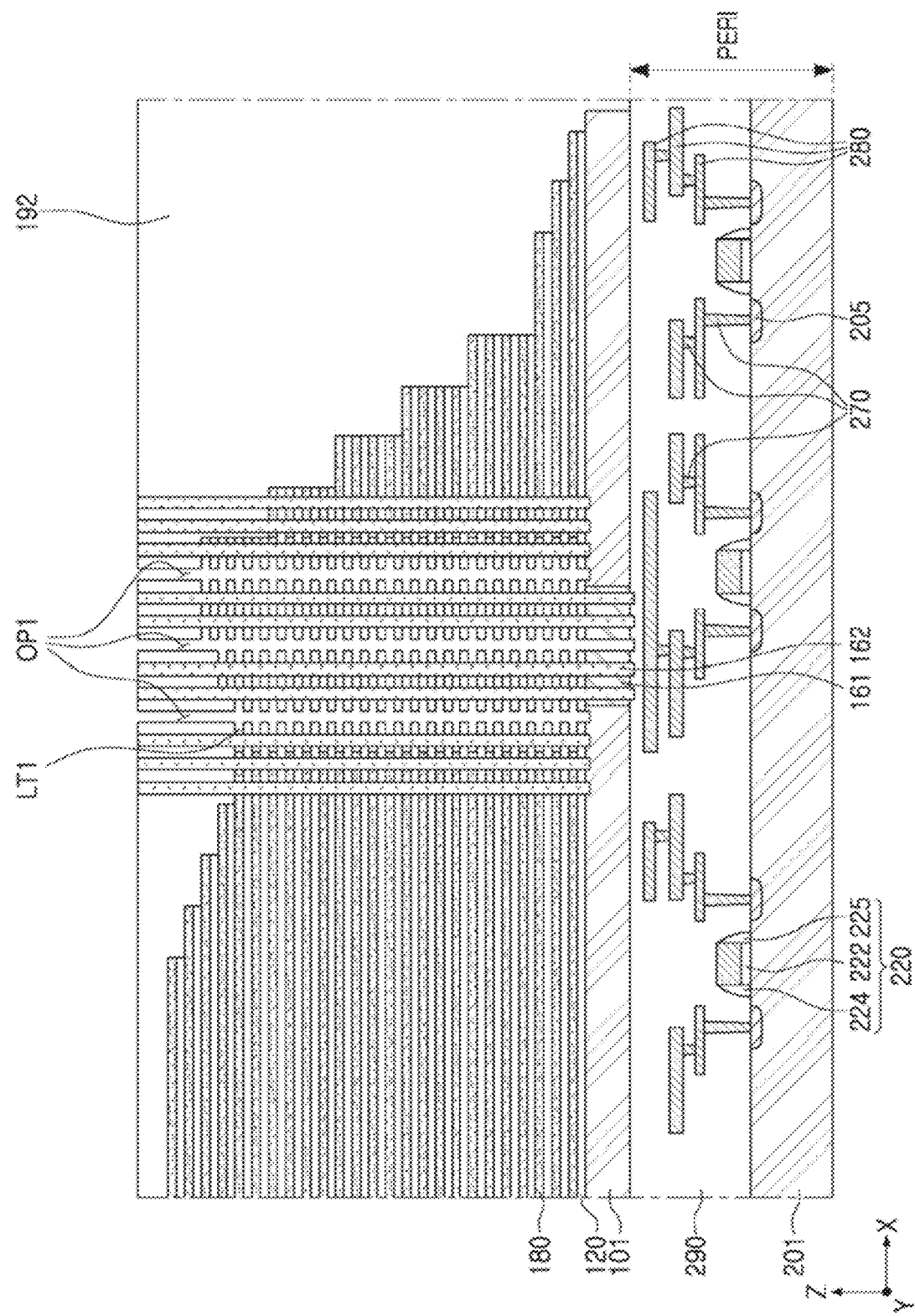

Referring to FIG. 11E, the sacrificial layers 180 exposed through the first openings OP1 may be partially removed.

The sacrificial layers 180 may be partially removed through a wet etching process. During the wet etching process, an etchant may be flowed through the first openings OP1, and the sacrificial layers 180 adjacent to the first openings OP1 may be removed. The sacrificial layers 180 may be selectively removed in relation to the interlayer insulating layers 120 and the first and second insulating layers 161 and 162. The interlayer insulating layers 120 and the first and second insulating layers 161 and 162 may be maintained without being removed. Accordingly, first tunnel portions LT1 extended horizontally between the interlayer insulating layers 120, from the first openings OP1, may be formed. The first tunnel portions LT1 may be extended by substantially the same length from side surfaces of the first openings OP1, and lengths of the first tunnel portions LT1 may vary.

In the process above, in the area in which the sacrificial layers 180 are removed, stability of the stack structure of the interlayer insulating layers 120 may degrade, but the stack structure may be stably supported by the second insulating layers 162.

Figure 11F:
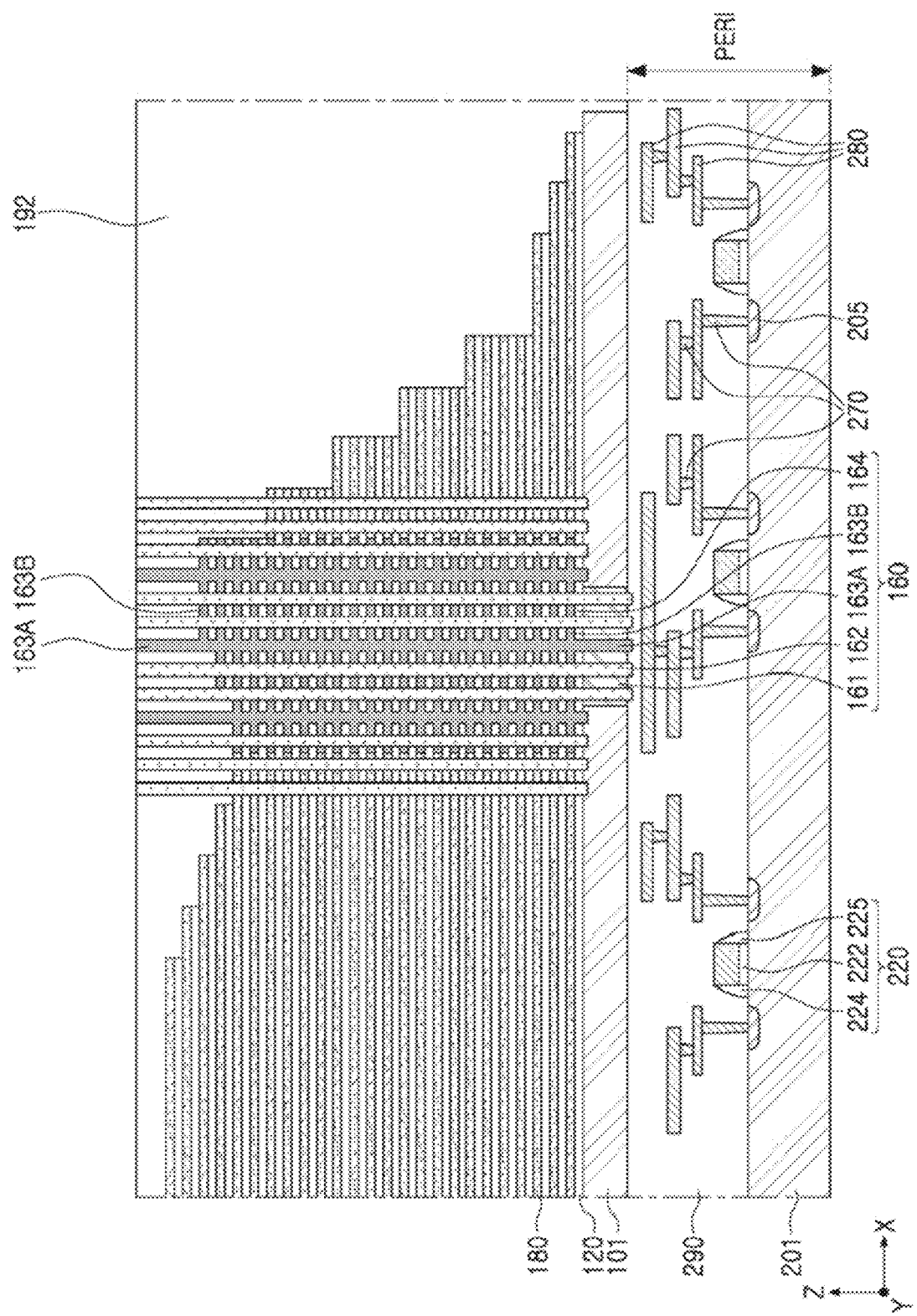

Referring to FIG. 11F, the third insulating layers 163A and 163B may be formed by depositing an insulating material in the first openings OP1 and the first tunnel portions LT1.

The insulating material may fill the first tunnel portions LT1, and may also fill the first openings OP1. The insulating material may be deposited through an ALD process, for example. Accordingly, the horizontal extension portions 163B of the third insulating layers 163A and 163B may be formed in the area in which the first tunnel portions LT1 are filled, and the vertical extension portions 163A may be formed in the area in which the first openings OP1 are filled. The horizontal extension portions 163B may be connected to each other between the second insulating layers 162, and outer surfaces thereof may be in contact with the sacrificial layers 180 in a boundary area.

By forming the third insulating layers 163A and 163B, the insulating area 160 including the first to third insulating layers 161, 162, 163A and 163B and the fourth insulating layers 164 may be formed. The fourth insulating layers 164 may be formed with areas disposed among the first to third insulating layers 161, 162, 163A and 163B of the interlayer insulating layers 120. In example embodiments of the present inventive concept, the insulating area 160 may be formed exclusively of an insulating material, and may be formed with the second insulating layers 162 and the vertical extension portions 163A, vertical insulating layers extended in perpendicular to a top surface of the substrate 101, and the horizontal extension portions 163B and the fourth insulating layers 164, horizontal insulating layers extended horizontally.

The first to fourth insulating layers 161, 162, 163A, 163B and 164 forming the insulating area 160 may have different compositions, or may have the same or similar compositions. Even when the first to fourth insulating layers 161, 162, 163A, 163B and 164 have the same composition, the first to fourth insulating layers 161, 162, 163A, 163B and 164 may be formed in different processes. Accordingly, the insulating layers may have different physical properties, and boundaries between the various insulating layers may be distinct.

Figure 11G:
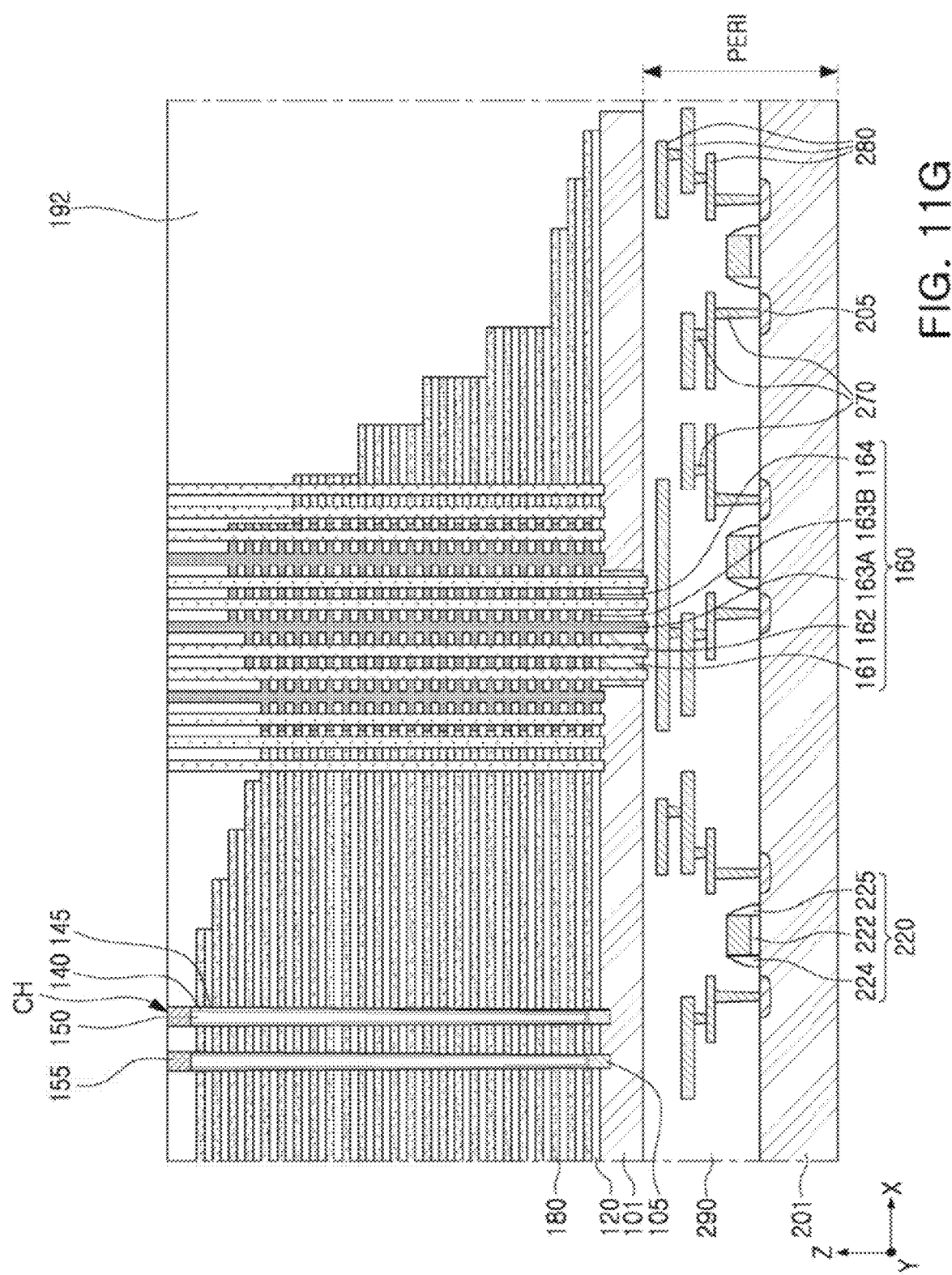

Referring to FIG. 11G, the channels CH penetrating through the stack structure of the sacrificial layers 180 and the interlayer insulating layers 120 may be formed.

A string separation area SS (see FIG. 4) may be formed by partially removing the sacrificial layers 180 and the interlayer insulating layers 120. The string separation area SS may be formed by allowing an area in which the string separation area SS is formed using a separate mask layer to be exposed, removing a predetermined number of the sacrificial layers 180 and the interlayer insulating layers 120 from an uppermost portion, and depositing an insulating material. The string separation area SS may be extended to a portion lower than an area in which the upper gate electrodes 130S in FIG. 4 are formed.

The channels CH may be formed by anisotropic etching of the sacrificial layers 180 and the interlayer insulating layers 120, and may have a hole shape. Due to a height of the stack structure, side walls of the channels CH might not be perpendicular to a top surface of the substrate 101. In example embodiments of the present inventive concept, the channels CH may partially recess the substrate 101. Thereafter, an epitaxial layer 105, at least a portion of the gate dielectric layer 145, the channel area 140, the channel insulating layer 150, and the channel pads 155 may be formed in the order stated. If there are dummy channels disposed in addition to the channels CH, the dummy channels may be formed together with the channels CH in this process. In some example embodiments of the present inventive concept, some of the dummy channels may penetrate through the insulating area 160.

The epitaxial layer 105 may be formed by a selective epitaxial growth (SEG) process. The epitaxial layer 105 may have a single layer or a plurality of layers. The epitaxial layer 105 may include polycrystalline silicon, single crystal silicon, polycrystalline germanium, or single crystal germanium, in which impurities are doped or not doped.

The gate dielectric layer 145 may have equal thicknesses through an ALD process or a CVD process. In this process, the gate dielectric layer 145 may be entirely or partially formed, and a portion extended in perpendicular to the substrate 101 along the channels CH may be formed in this process. The channel area 140 may be formed on the gate dielectric layer 145 within the channels CH. The channel insulating layer 150 may fill the channels, and may be formed of an insulating material. In some example embodiments of the present inventive concept, a space in the channel area 140 may be filled with a conductive material, rather than the channel insulating layer 150. The channel pad 155 may be formed of a conductive material, such as polycrystalline silicon, for example.

In example embodiments of the present inventive concept, the channels CH may also be formed before forming the second insulating layers 162 and the third insulating layers 163A and 163B described with reference to FIGS. 11C to 11F. Also, relative heights of the channels and the insulating area 160 may vary. For example, in some example embodiments of the present inventive concept, top surfaces of the channels CH may be positioned in a location higher or lower than top surfaces of the second insulating layers 162 and the third insulating layers 163A and 163B.

In the semiconductor device 100c in FIG. 10, the second insulating layers 162 may be formed together with the channels CH in this process. Thereafter, the insulating area 160 may be formed by performing the processes described with reference to FIGS. 11D to 11F. However, depending on a material of the gate dielectric layer 145, when some portions are removed along with the sacrificial layers 180, unevenness portions may be formed on side walls of the second insulating layers 162*a*.

Figure 11H:
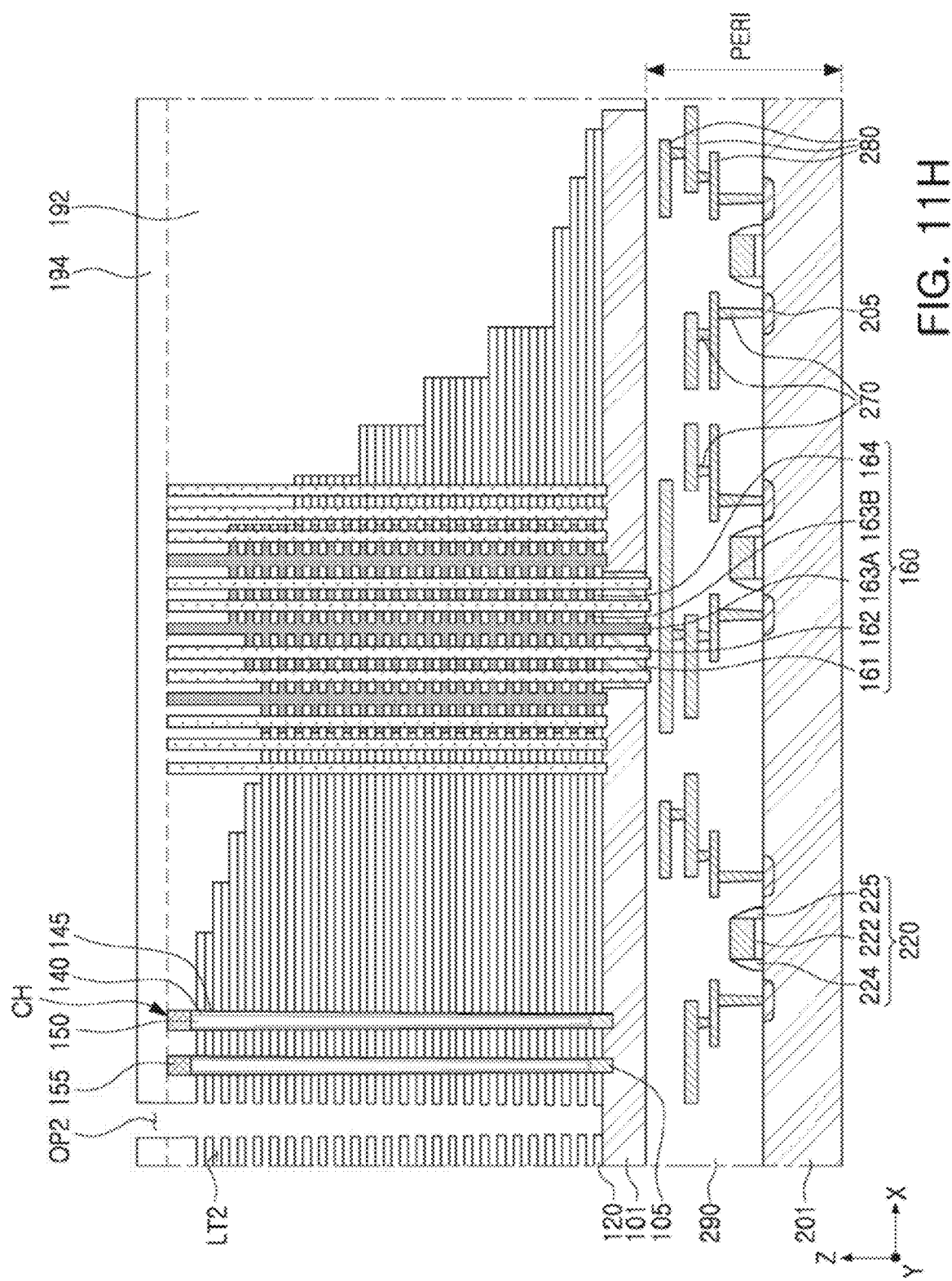

Referring to FIG. 11H, second openings OP2 penetrating through the stack structure of the sacrificial layers 180 and the interlayer insulating layers 120 may be formed, the sacrificial layers 180 may be removed through the second openings OP2, and second tunnel portions LT2 may be formed.

Before forming the second openings OP2, a second cell area insulating layer 194 may be formed on the channels CH. The second openings OP2 may be formed in the positions of the first and second separation areas MS1 and MS2 in FIG. 4. The second openings OP2 may be formed by forming a mask layer through a photolithography process, and by anisotropic etching of the stack structure. The second openings OP2 may be formed to have a trench shape extended in a Y direction, and the substrate 101 may be exposed in a lower portion of the second openings OP2.

The sacrificial layers 180 may be selectively removed using a wet etching process in relation to the interlayer insulating layers 120 and the insulating area 160. Accordingly, a plurality of the second tunnel portions LT2 may be formed between the interlayer insulating layers 120, and some of side walls of the gate dielectric layer 145 of the channels CH and the horizontal extension portions 163B of the third insulating layers 163A and 163B may be exposed through the second tunnel portions LT2.

Figure 11I:
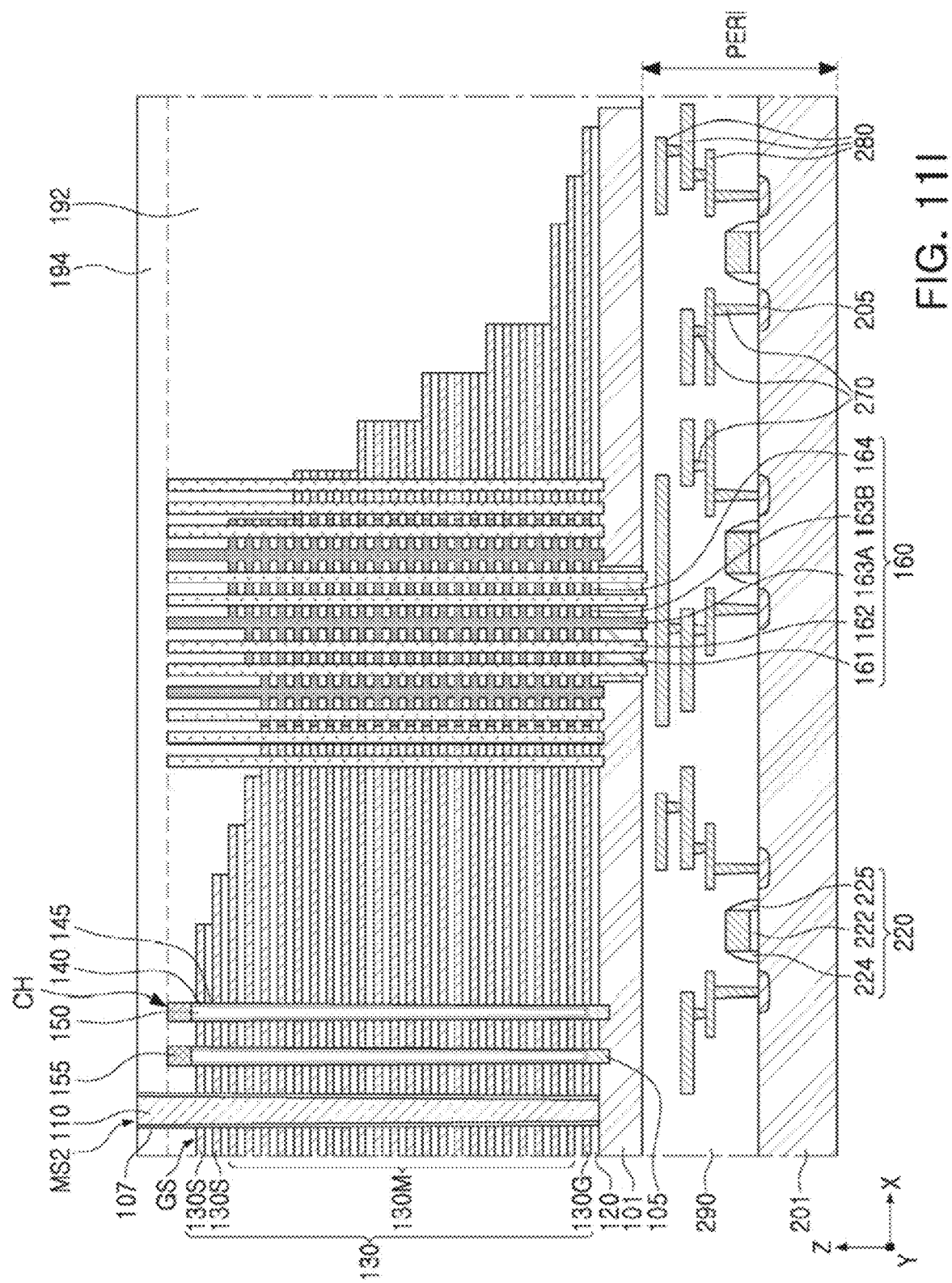

Referring to FIG. 11I, the gate electrodes 130 may be formed by filling the second tunnel portions LT2, in which the sacrificial layers 180 are removed, with a conductive material, and a source insulating layer 107 and a source conductive layer 110 may be formed in the second openings OP2.

The conductive material may fill the second tunnel portions LT2. The conductive material may include a metal, polycrystalline silicon, or metal silicide. After forming the gate electrodes 130, the conductive material deposited in the second openings OP2 may be removed through an additional process.

The source insulating layer 107 may have a spacer shape in the second openings OP2. For example, the source insulating layer 107 may be formed by removing an insulating material formed on the substrate 101 in lower portions of the second openings OP2, after depositing an insulating material.

Thereafter, the source conductive layer 110 may be formed by depositing a conductive material on the source insulating layer 107. The source insulating layer 107 and the source conductive layer 110 may be formed through the same process in the first and second separation areas MS1 and MS2 and may have the same structure. However, as described above, the source conductive layer 110 may function as a common source line CSL in the first separation area MS1, and may function as a dummy common source line in the second separation area MS2, for example.

Figure 11J:
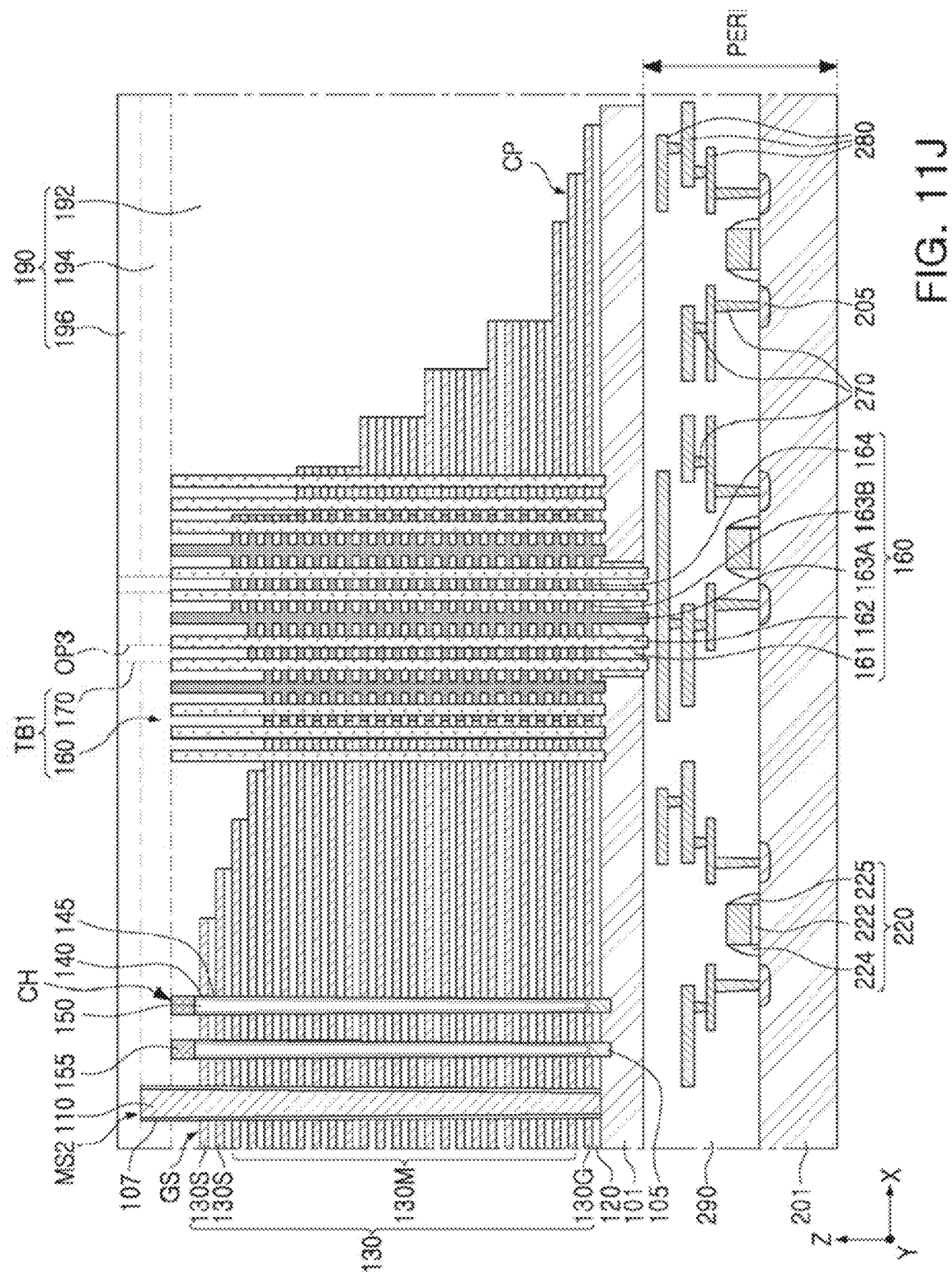

Referring to FIG. 11J, third openings OP3 may form the through contact plugs 170.

The cell area insulating layer 190 including the first to third cell area insulating layers 192, 194 and 196 may be formed by forming a third cell area insulating layer 196 covering the source insulating layer 107.

Thereafter, the third openings OP3 penetrating through the cell area insulating layer 190 and the insulating area 160 may be formed from an upper portion of the insulating area 160. The circuit wiring lines 280 of the peripheral circuit area PERI may be exposed in lower ends of the third openings OP3.

Then, referring to FIG. 11J along with FIG. 5A, the semiconductor device 100 may be manufactured by forming the through contact plugs 170 by filling the third openings OP3 with a conductive material, and forming the wiring line 175 connected to an upper portion of the through contact plugs 170. The manufacturing method described with reference to FIGS. 11A to 11J, however, is merely an example method of manufacturing the semiconductor device 100 in FIG. 5A, and the semiconductor device 100 may be manufactured by various other methods.

Meanwhile, with respect to the semiconductor device 100*b* in FIG. 9, in the process above, the wiring insulating layer 172 may be preferentially formed in the third openings OP3. Then, the wiring insulating layer 172 may be removed to allow the circuit wiring line 280 to be exposed on lower ends of the third openings OP3, the through contact plugs 170 may be formed, and the semiconductor device may be manufactured.

FIGS. 12A to 12G are schematic cross-sectional diagrams illustrating a method of manufacturing a semiconductor device according to an example embodiment of the present inventive concept. FIGS. 12A to 12G illustrate areas corresponding to the areas illustrated in FIG. 8. In the descriptions below, the descriptions overlapped with the descriptions described with reference to FIGS. 11A to 11J will not be repeated.

Figure 12A:
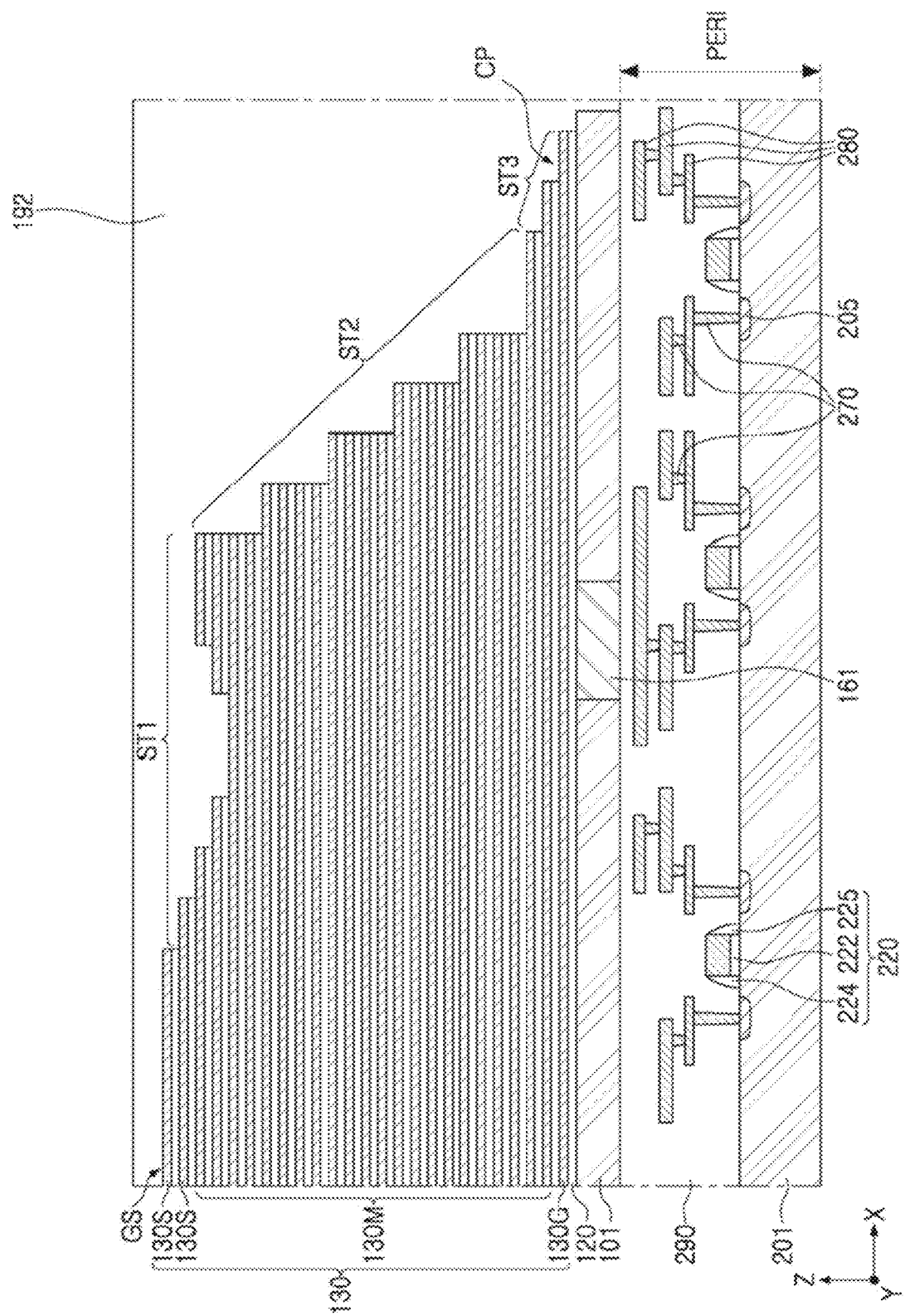
FIGS. 12A to 12G are schematic cross-sectional diagrams illustrating a method of manufacturing a semiconductor device according to an example embodiment in the present inventive concept.

Referring to FIG. 12A, a peripheral circuit area PERI may be formed on a base substrate 201, and a substrate 101 on which a memory cell area is provided and a first insulating layer 161 may be formed in an upper portion of the peripheral circuit area PERI. Thereafter, a stack structure GS including gate electrodes 130 may be formed on the substrate 101.

The peripheral circuit area PERI and the first insulating layer 161 may be formed in a similar manner to what is described above with reference to FIG. 11A.

Thereafter, the stack structure GS may be formed by alternately layering the gate electrodes 130 and the interlayer insulating layers 120, and the gate electrodes 130 and interlayer insulating layers 120 may be partially removed to allow the gate electrodes 130 to be extended by different lengths in an X direction. Accordingly, the gate electrodes 130 may form a staircase shape, and a contact area CP may be provided. The gate electrodes 130 may include an upper stack ST1, an intermediate stack ST2, and a lower stack ST3, but the present invention is not limited thereto. Thereafter, a first cell area insulating layer 192 covering an upper portion of the stack structure GS may be formed.

Figure 12B:
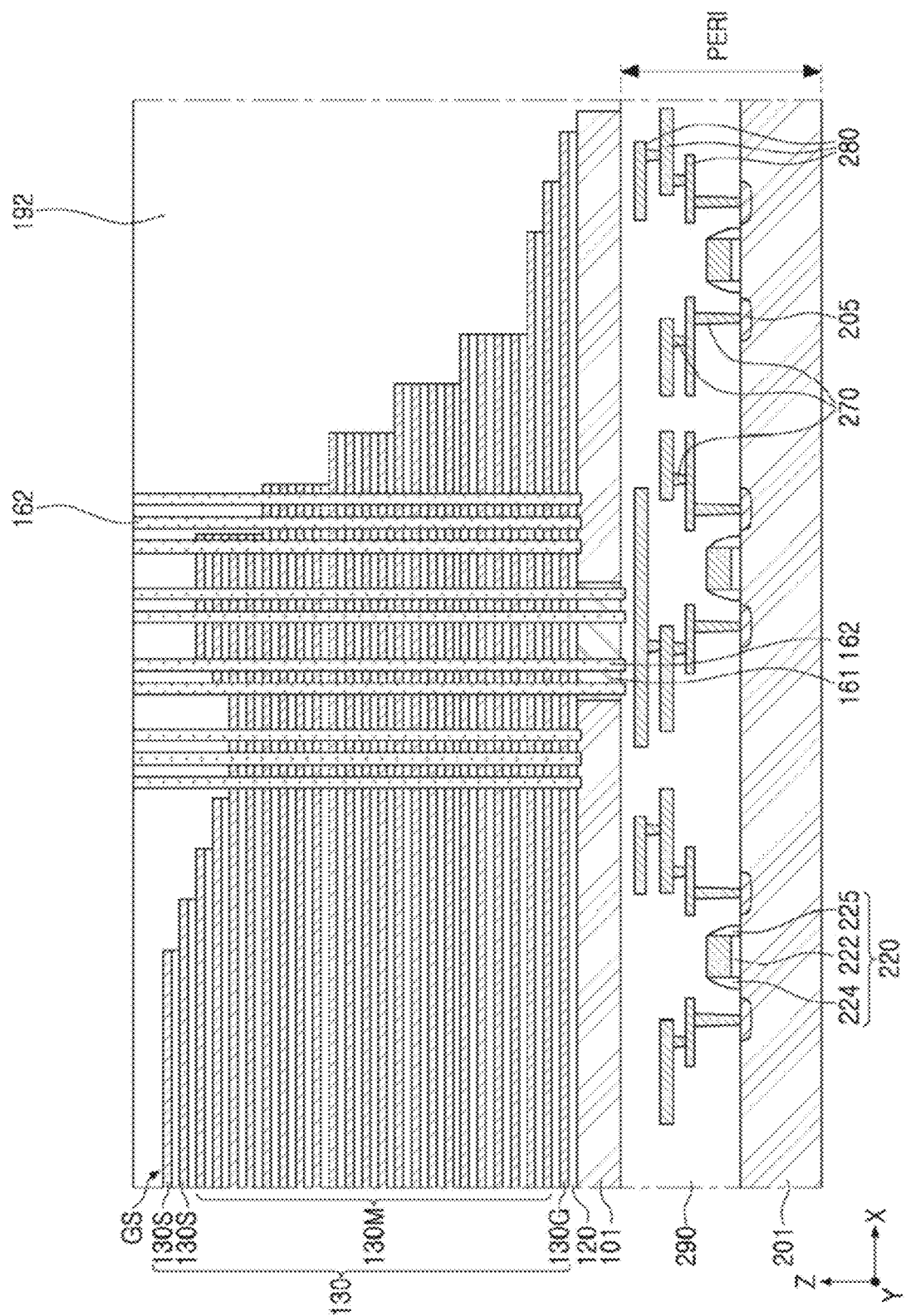

Referring to FIG. 12B, second insulating layers 162 penetrating through the stack structure of the gate electrodes 130 and the interlayer insulating layers 120 may be formed.

The second insulating layers 162 may be formed at equal intervals in an area including the first insulating layer 161. The second insulating layers 162 may be formed by partially removing the first cell area insulating layer 192, the gate electrodes 130, and the interlayer insulating layers 120 to form an opening, and filling the opening with an insulating material. A material of the second insulating layers 162 may be different from a material of the gate electrodes 130.

Figure 12C:
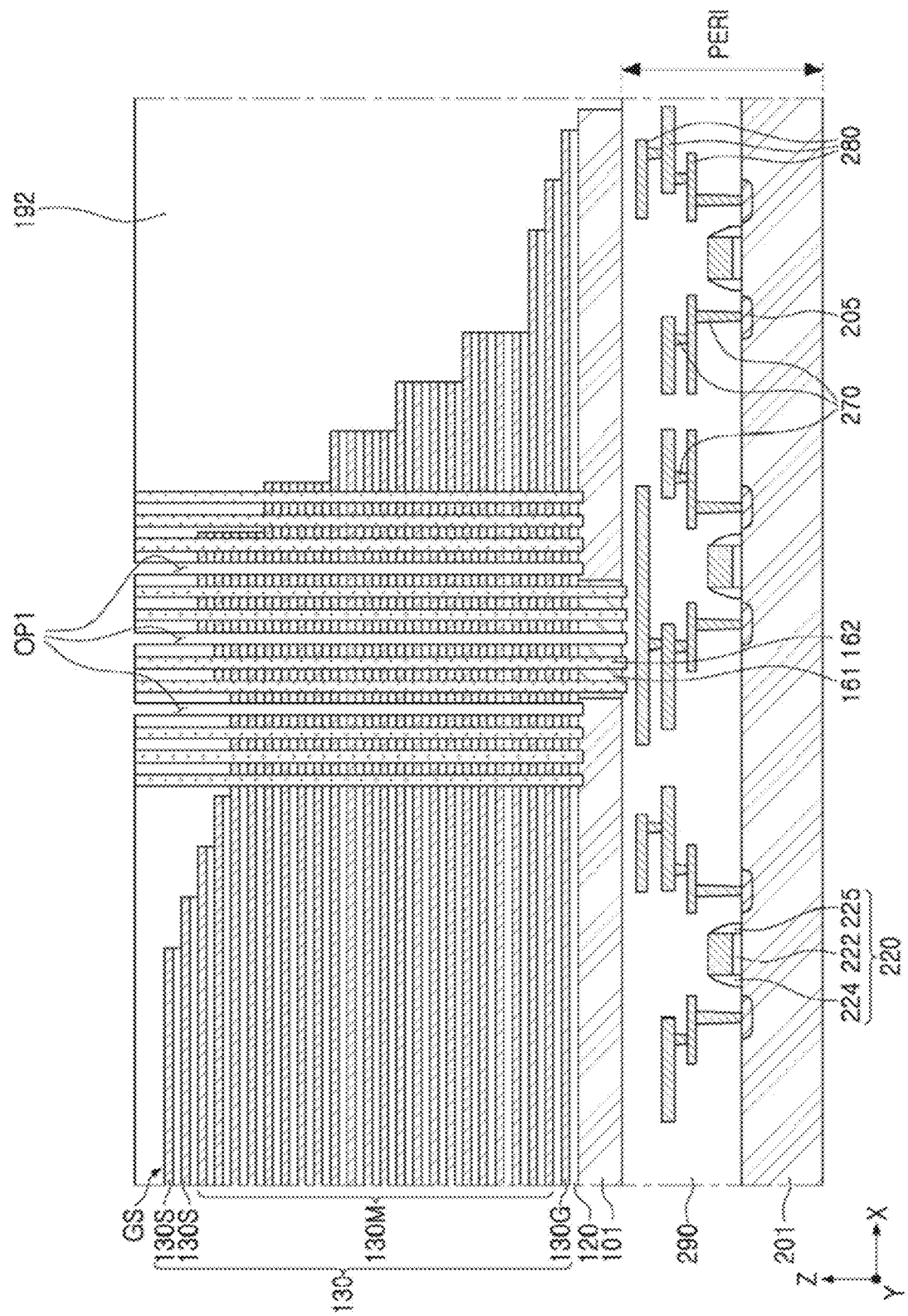

Referring to FIG. 12C, first openings OP1 penetrating through the stack structure of the gate electrodes 130 and the interlayer insulating layers 120 may be formed.

The first openings OP1 may be formed by removing the first cell area insulating layer 192, the gate electrodes 130, and the interlayer insulating layers 120 in an area corresponding to the vertical extension portions 163A of the third insulating layers 163A and 163B in FIG. 8. The first openings OP1 may be formed at equal intervals between the second insulating layers 162.

Figure 12D:
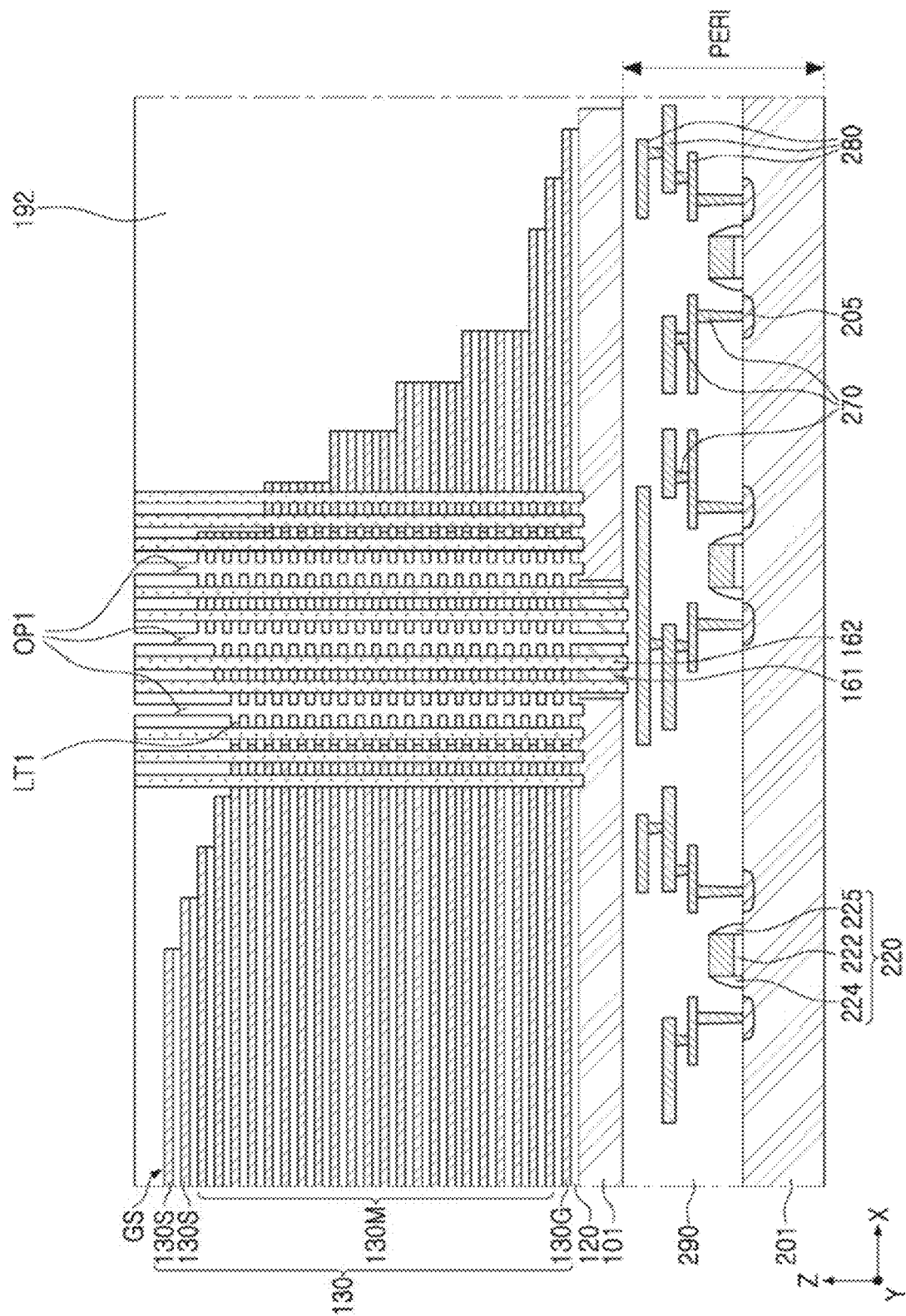

Referring to FIG. 12D, the gate electrodes 130 exposed through the first openings OP1 may be partially removed.

The gate electrodes 130 may be partially removed through a wet etching process, for example. During the wet etching process, an etchant may be flowed through the first openings OP1, and the gate electrodes 130 adjacent to the first openings OP1 may be removed. The gate electrodes 130 may be selectively removed in relation to the interlayer insulating layers 120 and the first and second insulating layers 161 and 162, and the interlayer insulating layers 120 and the first and second insulating layers 161 and 162 may be maintained without being removed. Accordingly, first tunnel portions LT1 extended horizontally between the interlayer insulating layers 120, from the first openings OP1, may be formed.

Figure 12E:
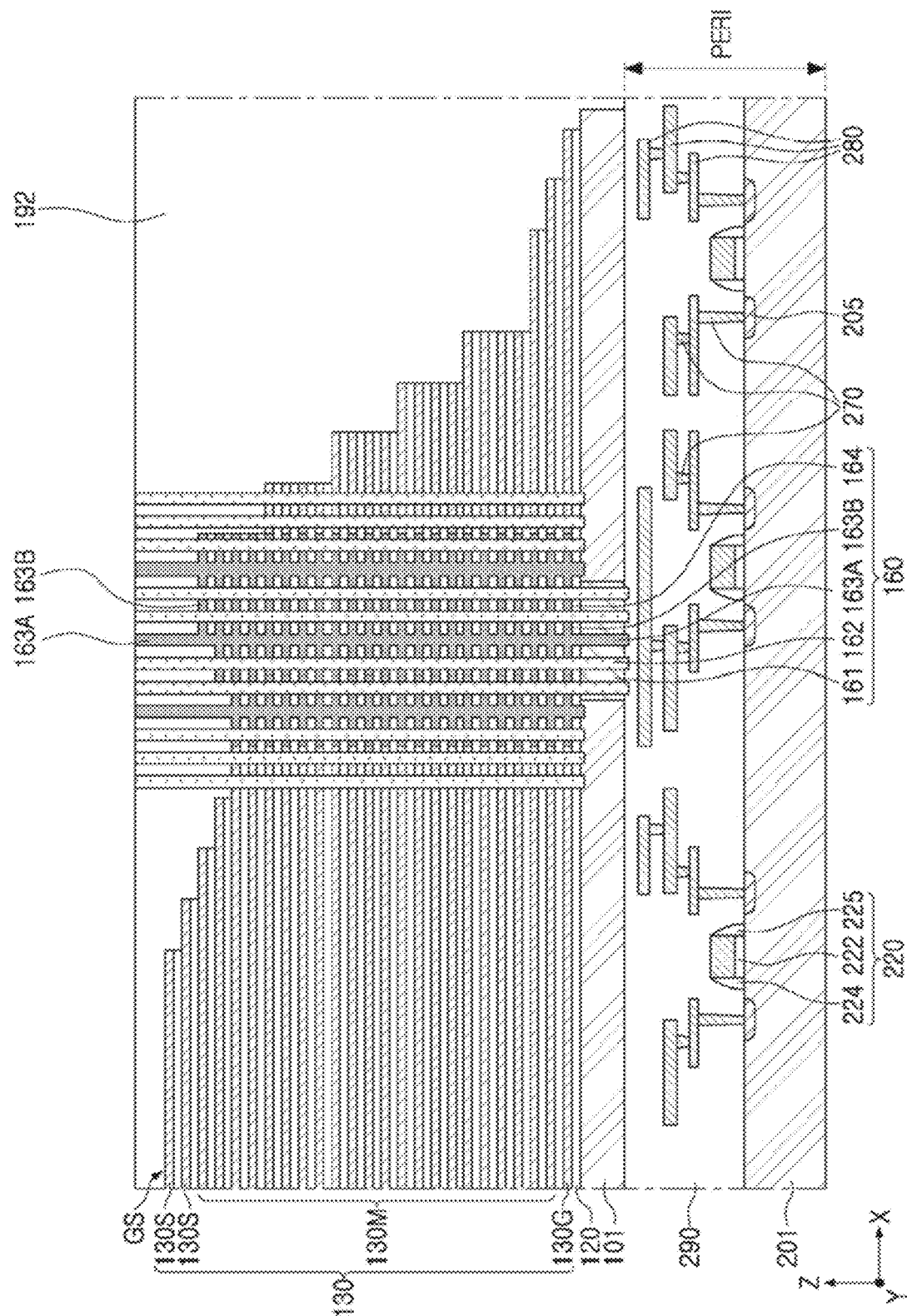

Referring to FIG. 12E, third insulating layers 163A and 163B may be formed by depositing an insulating material in the first openings OP1 and the first tunnel portions LT1.

The insulating material may be deposited to fill the first tunnel portions LT1 and fill the first openings OP1. The insulating material may be deposited through an ALD process, for example. Accordingly, the horizontal extension portions 163B of the third insulating layers 163A and 163B may be formed in an area in which the first tunnel portions LT1 are filled, and the horizontal extension portions 163B may be formed in an area in which the first openings OP1 are filled. The horizontal extension portions 163B may be connected to each other between the second insulating layers 162, and outer surfaces thereof may be in directly contact with the gate electrodes 130 in an edge area.

By forming the third insulating layers 163A and 163B, an insulating area 160 including the first to third insulating layers 161, 162, 163A and 163B and the fourth insulating layers 164 may be formed. The insulating area 160 may be formed exclusively of an insulating material, and may be an area in which the gate electrodes 130 are not disposed.

Figure 12F:
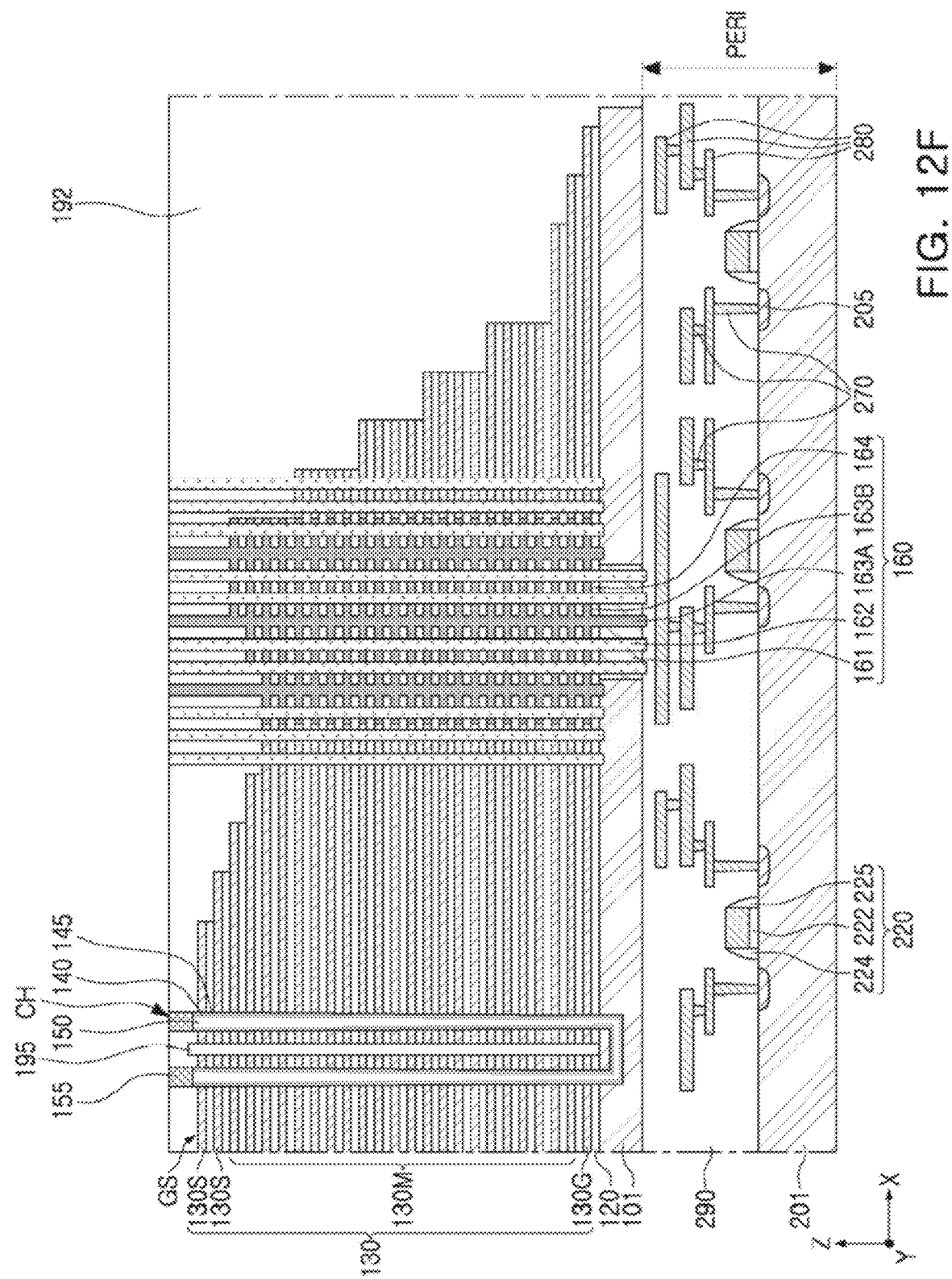

Referring to FIG. 12F, a channel CH, penetrating through a stack structure of the gate electrodes 130 and the interlayer insulating layers 120, may be formed.

The channel CH may be formed by anisotropic etching of the stack structure GS, and may be formed to have a hole shape, having a "U" shape penetrating into the substrate 101. To this end, a separate sacrificial layer may be provided in the substrate 101 in advance. Then, an epitaxial layer 105, a gate dielectric layer 145, a channel area 140, a channel insulating layer 150, and channel pads 155 may be formed in the channels CH. A separation insulating layer 195 may be formed between the channels CH.

In example embodiments of the present inventive concept, the channel CH and the separation insulating layer 195 may be formed before forming the insulating area 160. For example, the channel CH may be formed preferentially in the process described with reference to FIG. 12A.

Figure 12G:
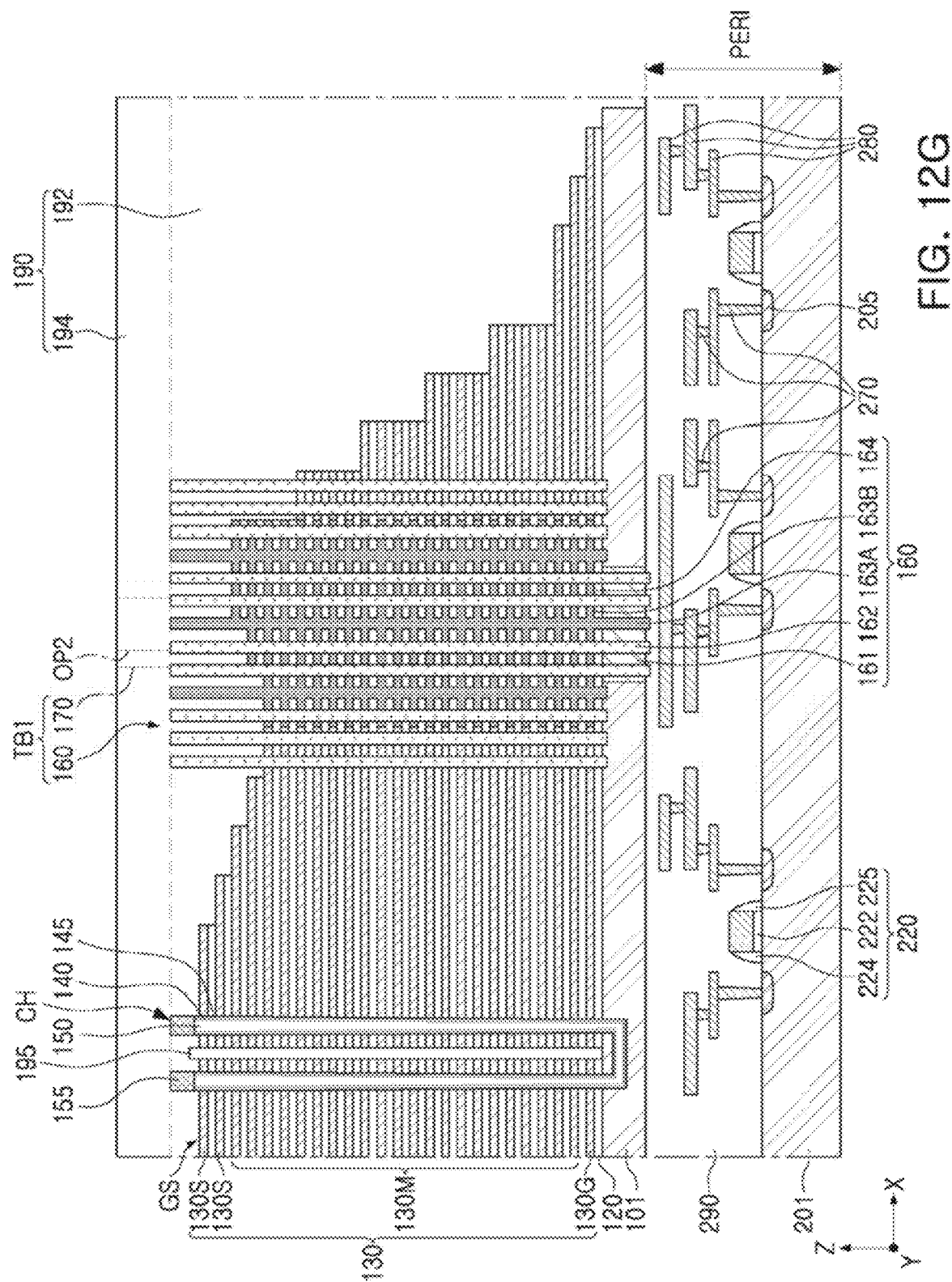

Referring to FIG. 12G, second openings OP2 may be formed to form the through contact plugs 170.

A cell area insulating layer 190 including first and second cell area insulating layers 192 and 194 may be formed by forming the second cell area insulating layer 194 covering the source insulating layer 107. Thereafter, the second openings OP2 penetrating through the cell area insulating layer 190 and the insulating area 160 may be formed from an upper portion of the insulating area 160. The circuit wiring lines 280 of the peripheral circuit area PERI may be exposed on lower ends of the second openings OP2.

Referring to FIG. 12G along with FIG. 8, the through contact plugs 170 penetrating through the cell area insulating layer 190 and the insulating area 160 may be formed, the wiring line 175 connected to an upper end of the through contact plugs 170 may be formed, and the semiconductor device 100a may be manufactured. The manufacturing method described with reference to FIGS. 12A to 12G, however, is merely an example method of manufacturing the semiconductor device 100a in FIG. 5A, and the semiconductor device 100a may also be manufactured by various other methods.

Figure 13:
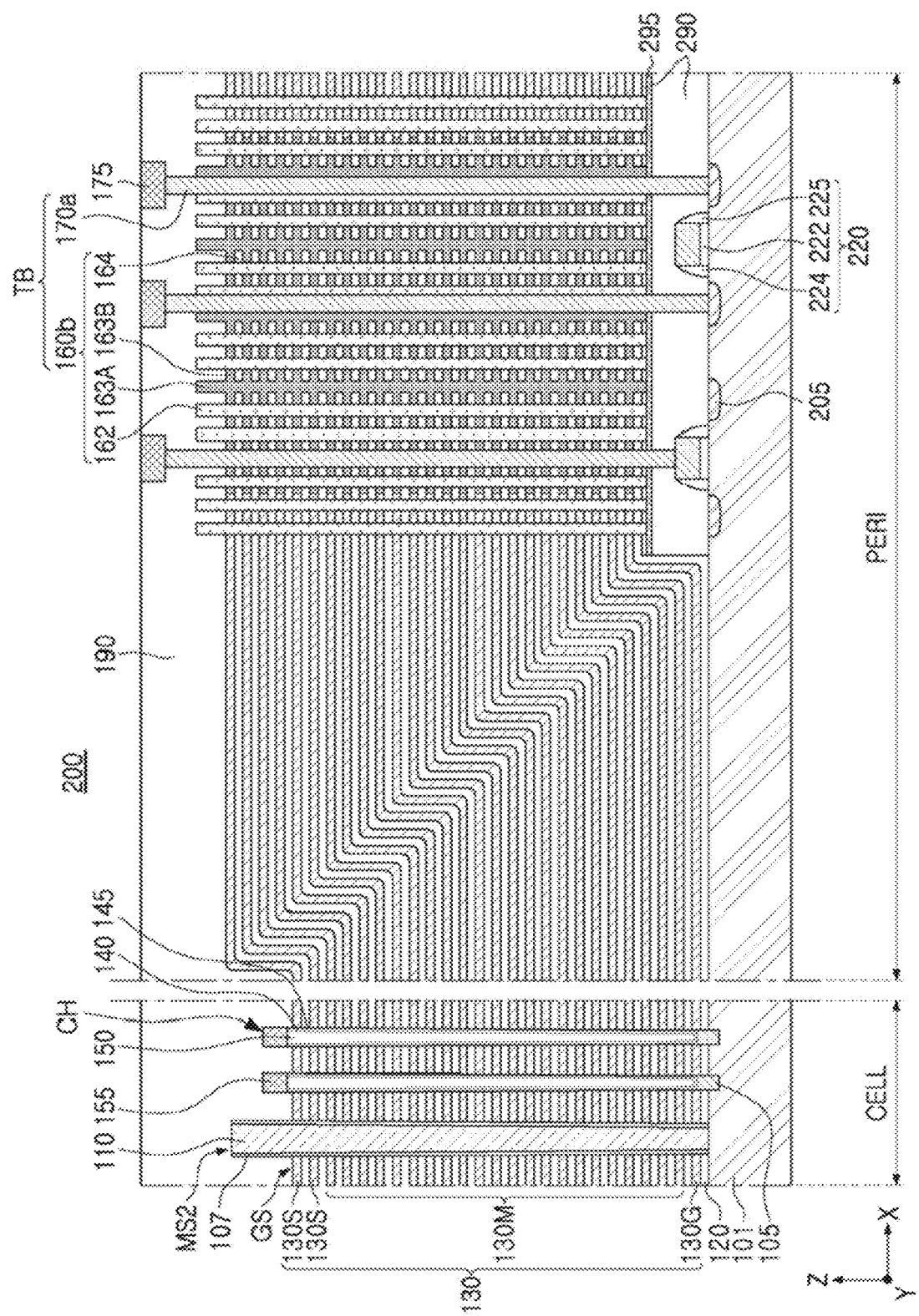
FIG. 13 is a schematic cross-sectional diagram illustrating a semiconductor device according to an example embodiment in the present inventive concept.

FIG. 13 is a schematic cross-sectional diagram illustrating a semiconductor device according to an example embodiment of the present inventive concept.

Referring to FIG. 13, a semiconductor device 200 may include a memory cell area CELL and a peripheral circuit area PERI. For example, in the semiconductor device 200, the peripheral circuit area PERI may be disposed in at least one side of the memory cell area CELL. As for the memory cell area CELL, the descriptions of the first area A described with reference to FIGS. 4 to 5B may be applied to the memory cell area CELL.

The peripheral circuit area PERI may include circuit devices 220 disposed on a substrate 101 in which the memory cell area CELL is disposed, source/drain areas 205 disposed in the substrate 101, an peripheral area insulating layer 290 disposed in a predetermined height on the circuit devices 220, an etching stop layer 295 in the peripheral area insulating layer 290, a stack structure GS of gate electrodes 130, curved and extended onto the peripheral area insulating layer 290, through wiring area TB penetrating through the stack structure GS and electrically connected to the circuit devices 220. In example embodiments of the present inventive concept, the peripheral circuit area PERI might not only include an area in which the stack structure GS of the gate electrodes 130 is disposed as shown in FIG. 13 but may also include an area in which the stack structure GS of the gate electrodes 130 is not disposed.

As for the source/drain areas 205 and the circuit devices 220, the descriptions described with reference to FIGS. 4 to 5B may be applied to the source/drain areas 205 and the circuit devices 220. The peripheral area insulating layer 290 may have a relatively low height, and the gate electrodes 130 and the interlayer insulating layers 120 may be curved and extended onto an upper portion of the peripheral area insulating layer 290 from the memory cell area CELL.

The through wiring area TB may be an area including a wiring structure for connecting the source/drain areas 205 and the circuit devices 220 to a wiring line 175 provided in an upper portion. The through wiring area TB may include a through contact plugs 170a penetrating through the stack structure of the gate electrodes 130 and extended in a Z direction, and an insulating area 160b surrounding the through contact plug 170a.

In the insulating area 160b, the gate electrodes 130 might not be extended or disposed, and the insulating area 160b may be formed of an insulating material. The insulating area 160b may include the second insulating layers 162 extended vertically to a top surface of the substrate 101, third insulating layers 163A and 163B disposed between the second insulating layers 162, and fourth insulating layers 164 position on the same level as the interlayer insulating layers 120. For example, as the insulating area 160b does not penetrate through the substrate 101, the insulating area 160b might not include the first insulating layer 161, unlike the insulating area 160 described above with reference to FIGS. 4 to 5B. The second insulating layers 162 and the vertical extension portions 163A of the third insulating layers 163A and 163B may be extended to a top surface of the etching stop layer 295. In some example embodiments of the present inventive concept, the etching stop layer 295 may be omitted, or may be disposed on a top surface of the peripheral area insulating layer 290. As for the other components, the descriptions of the insulating area 160 described with reference to FIGS. 4 to 5B may be applied.

The through contact plugs 170a may penetrate through the insulating area 160b and be extended perpendicularly with respect to a top surface of the substrate 101. The through contact plugs 170a may connect the source/drain areas 205 and the circuit devices 220 in the peripheral circuit area PERI to the wiring structure in an upper portion, such as the wiring line 175, and the peripheral circuit area PERI may be electrically connected to the memory cell area CELL through the wiring structure.

According to the aforementioned example embodiments of the present inventive concept, by forming the through wiring area configured with a plurality of insulating layers in the memory cell area, a semiconductor device having a high degree of integration and reliability may be provided.

While example embodiments of the present inventive concept have been shown and described above, it will be apparent to those skilled in the art that modifications and variations could be made without departing from the scope of the present invention.

What is claimed is:

1. A semiconductor device, comprising:
   a peripheral circuit area disposed on a first substrate and including one or more circuit devices;
   a memory cell area disposed on a second substrate, over the peripheral circuit area, and including a plurality of gate electrodes spaced apart from each other and stacked vertically on the second substrate; and
   a through wiring area including a through contact plug and an insulating area surrounding the through contact plug, the through contact plug extended in a first direction through the memory cell area and the second substrate and electrically connecting the memory cell area to the circuit devices,
   wherein the insulating area includes:
   a first insulating layer penetrating through the second substrate and disposed in parallel to the second substrate,
   a plurality of second insulating layers extended in the first direction, over the peripheral circuit area, and
   a third insulating layer having a vertical extension portion and a plurality of horizontal extension portions, the vertical extension portion being disposed between the second insulating layers and extended in the first direction, and the plurality of horizontal extension portions being extended in a second direction parallel to a top surface of the second substrate from a side surface of the vertical extension portion to contact the second insulating layers,
   wherein the vertical extension portion and the plurality of horizontal extension portions consist of an insulating material,
   wherein each of the plurality of horizontal extension portions is positioned on a same level as the plurality of gate electrodes to separate the plurality of gate electrodes horizontally, and
   wherein the plurality of horizontal extension portions continuously extend from the vertical extension portion to form a multiple-cross shape.

2. The semiconductor device of claim 1, wherein at least a portion of the second insulating layers penetrate through at least a portion of the first insulating layer and the other portions of the second insulating layers are disposed on the second substrate around the first insulating layer.

3. The semiconductor device of claim 2, wherein the second substrate has a recess in the top surface thereof.

4. The semiconductor device of claim 1, wherein the vertical extension portion of the third insulating layer is one of a plurality of vertical extension portions which are disposed at equal intervals, and each of the plurality of vertical extension portions are disposed between the second insulating layers.

5. The semiconductor device of claim 1, wherein the second insulating layers have a circular-shaped cross-section or an oval-shaped cross-section.

6. The semiconductor device of claim 1, wherein at least a portion of the vertical extension portion of the third insulating layer has a line shape.

7. The semiconductor device of claim 1, wherein the memory cell area further includes interlayer insulating layers alternately stacked with the gate electrodes, and channels penetrating through the gate electrodes and extended vertically on the second substrate.

8. The semiconductor device of claim 7, wherein the insulating area further includes a fourth insulating layer at least partially filling spaces of the first to third insulating layers, wherein the fourth insulating layer is formed as ends of the interlayer insulating layers.

9. The semiconductor device of claim 1, wherein the gate electrodes are in contact with the horizontal extension portions of the third insulating layer on a boundary between the gate electrodes and the through wiring area.

10. The semiconductor device of claim 1, wherein the insulating area has a first width in the second substrate, and has a second width, greater than the first width, on the second substrate.

11. The semiconductor device of claim 1, wherein the first insulating layer has a top surface that is coplanar with the top surface of the second substrate.

12. The semiconductor device of claim 1, wherein each of the second insulating layers has a conductive layer disposed therein.

13. The semiconductor device of claim 1, wherein the third insulating layer has a seam in at least one area thereof.

14. The semiconductor device of claim 1, wherein the through contact plug penetrates through at least some portions of the second and third insulating layers, and penetrates through the first insulating layer.

15. The semiconductor device of claim 1, further comprising: a wiring insulating layer disposed on a side wall of the through contact plug.

16. A semiconductor device, comprising:
   a peripheral circuit area disposed on a first substrate and including one or more circuit devices;
   a memory cell area disposed on a second substrate disposed in an upper portion of the first substrate, and including a plurality of gate electrodes, spaced apart from each other and stacked vertically on the second substrate, and channels, penetrating through the gate electrodes and extended vertically on the second substrate; and
   a through wiring area including an insulating area penetrating through the gate electrodes and the second substrate, and a through contact plug penetrating through the insulating area and extended vertically, wherein the insulating area has a plurality of vertical extension portions extended in a first direction perpendicular to the first and second substrates, and horizontal extension portions extended in a second direction, perpendicular to the first direction, from side surfaces of the vertical extension portions, wherein the plurality of vertical extension portions and horizontal extension portions consist of an insulating material, wherein portions of the plurality of horizontal extension portions are positioned on a same level as the plurality of gate electrodes to separate the plurality of gate electrodes horizontally, and wherein the portions of the plurality horizontal extension continuously extend from portions of the plurality of vertical extension portions to form a multiple-cross shape.

17. The semiconductor device of claim 16, wherein the horizontal extension portions are in contact with side surfaces of the gate electrodes.

18. The semiconductor device of claim 16, wherein the insulating area further includes a support structure extended in the first direction in a peripheral area of the vertical extension portions and including an insulating material.

19. A semiconductor device, comprising:
a first area including one or more first devices including gate electrodes spaced apart from each other and stacked vertically;
a second area disposed in a side of the first area and including one or more second devices; and
a through wiring area disposed in an upper portion of the second area, and including a through wiring structure electrically connecting the first devices to the second devices and an insulating area surrounding the through wiring structure, wherein the insulating area includes vertical insulating layers extended in a first direction, and horizontal insulating layers extended in a second direction, perpendicular to the first direction, between the vertical insulating layers, wherein the insulating area is at least partially surrounded by the gate electrodes forming the first devices, wherein portions of the horizontal insulating layers are positioned on a same level as the gate electrodes to separate the gate electrodes horizontally, and wherein the portions of the horizontal insulating layers continuously extend from portions of the vertical insulating layers to form a multiple-cross shape.

* * * * *